United States Patent [19]

Fukui et al.

[11] Patent Number: 5,138,253
[45] Date of Patent: Aug. 11, 1992

[54] WAVE-LEAKAGE MEASURING APPARATUS AND MEASURING METHOD

[75] Inventors: Tamio Fukui, Nara; Isao Momoji, Uda, both of Japan

[73] Assignee: Matsushita Electric Industrial Co., Ltd., Osaka, Japan

[21] Appl. No.: 538,672

[22] Filed: Jun. 13, 1990

Related U.S. Application Data

[63] Continuation of Ser. No. 318,424, Mar. 1, 1989, abandoned, which is a continuation of Ser. No. 29,223, Mar. 23, 1987, abandoned.

[51] Int. Cl.[5] .............................................. G01R 2/00
[52] U.S. Cl. ..................................................... 324/95
[58] Field of Search ..................... 324/73 R, 158 P, 95

[56] References Cited

U.S. PATENT DOCUMENTS 4,354,153 10/1982 Lentz ................................... 324/95
4,565,967 1/1986 Eisenbrandt et al. .............. 324/95

Primary Examiner—Stephen M. Baker
Attorney, Agent, or Firm—Wenderoth, Lind & Ponack

[57] ABSTRACT

A wave-leakage measuring apparatus compares the power density of the leakage waves, in the portions on the upper side, the lower side, the left side, the right side of the high-frequency heating apparatus which is being measured in two steps, with the leakage locations by a central data processing computer to select one of the maximum wave-leakage locations. The apparatus then brings one of the power-density detectors to the maximum wave-leakage location by a robot and precisely measures the power density of the leakage waves while a wave-mode converting apparatus of the high-frequency heating apparatus which is being measured makes at least one rotation. The apparatus then automatically determines the acceptability of the measured values by the central data processing computer.

16 Claims, 19 Drawing Sheets $m \leq \ell$ $p \leq \ell$

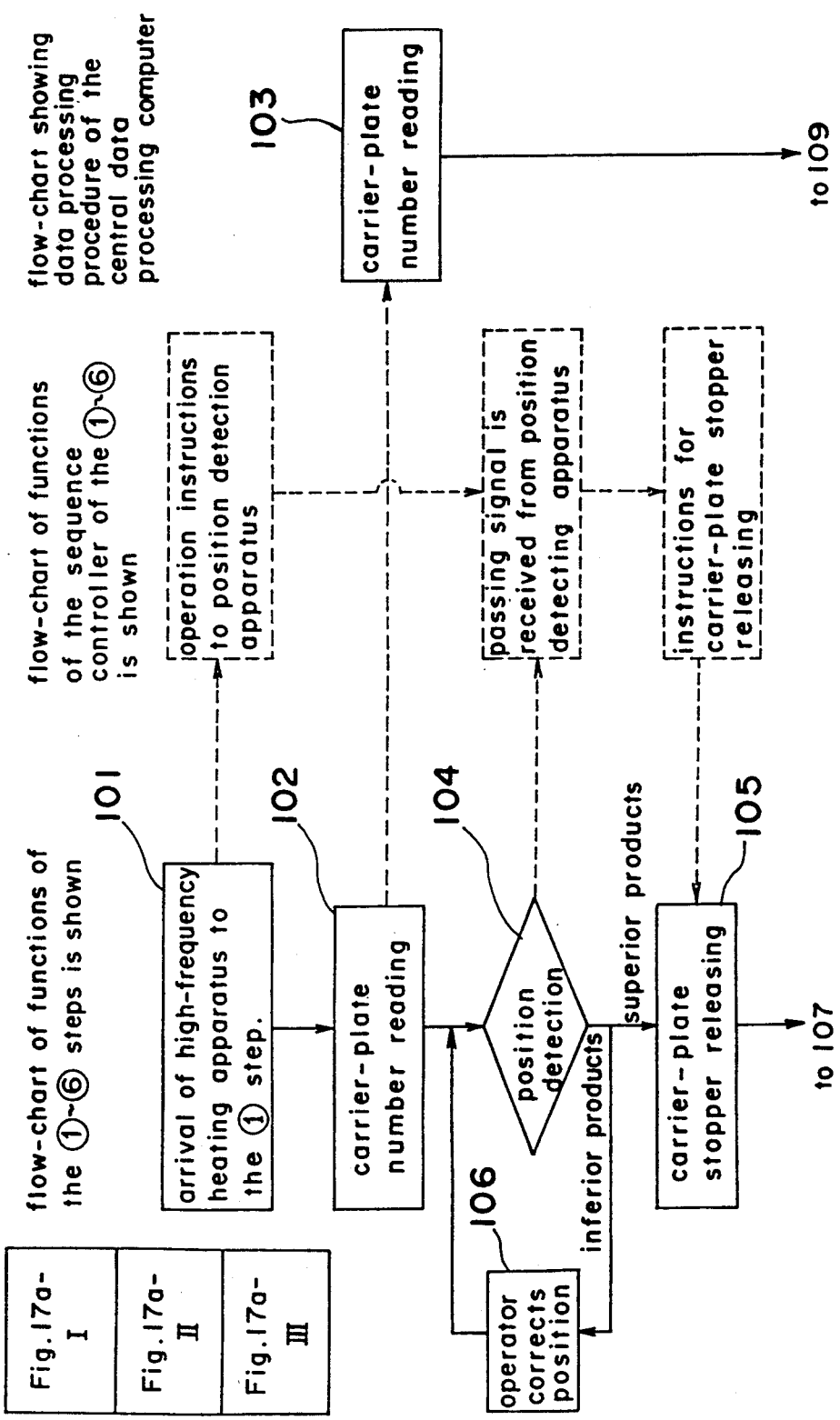

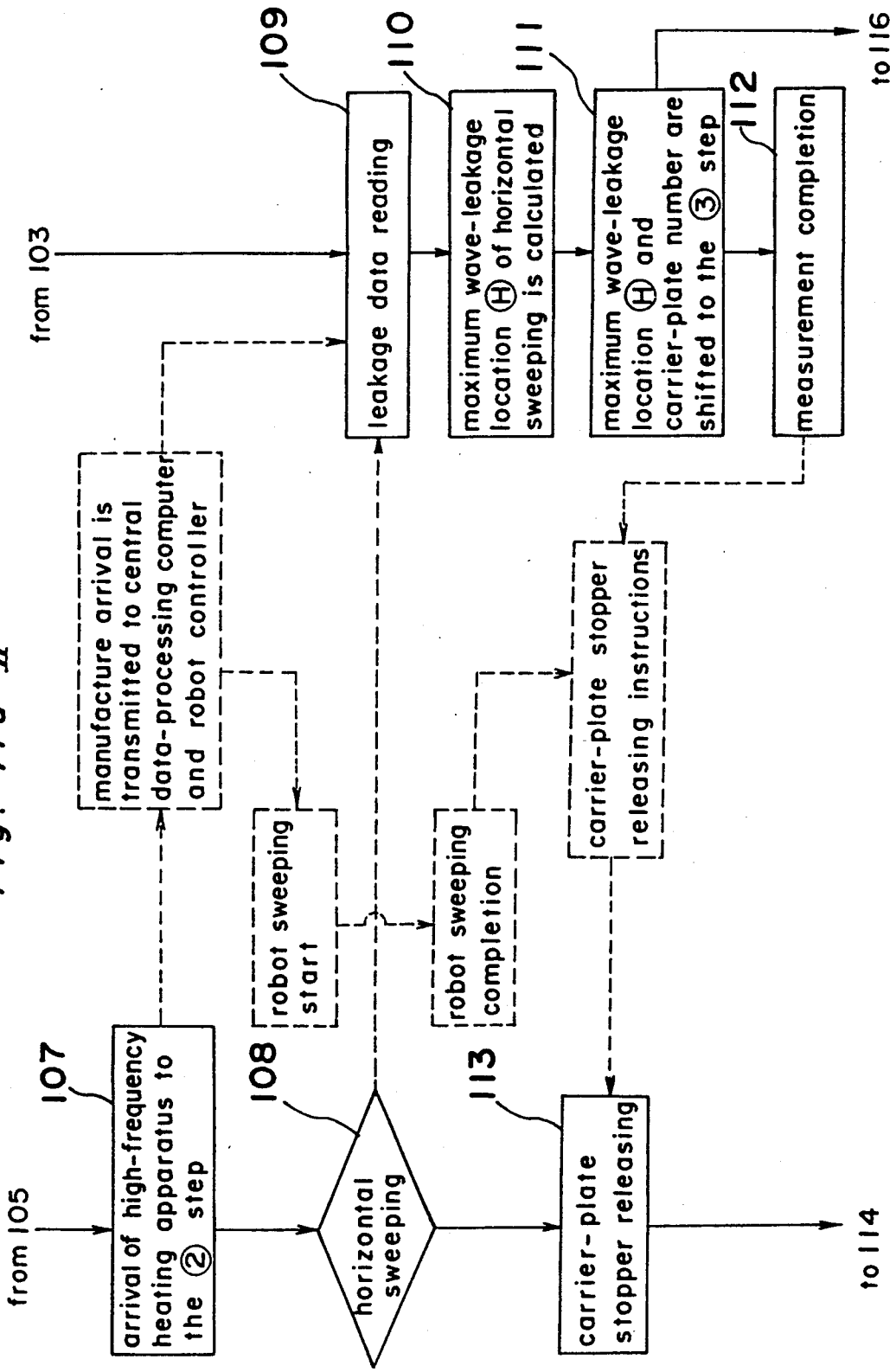
Fig. 17a-II

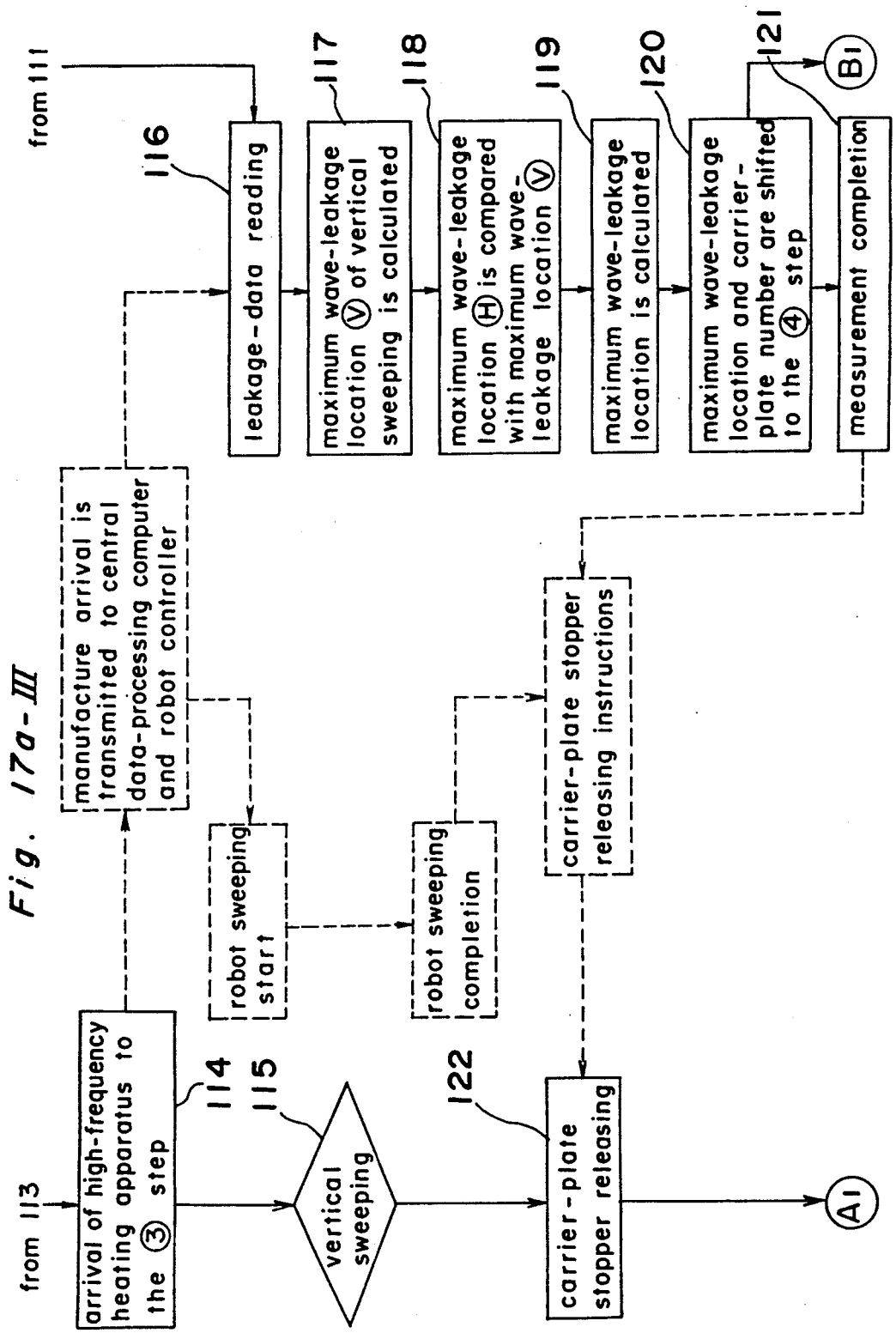

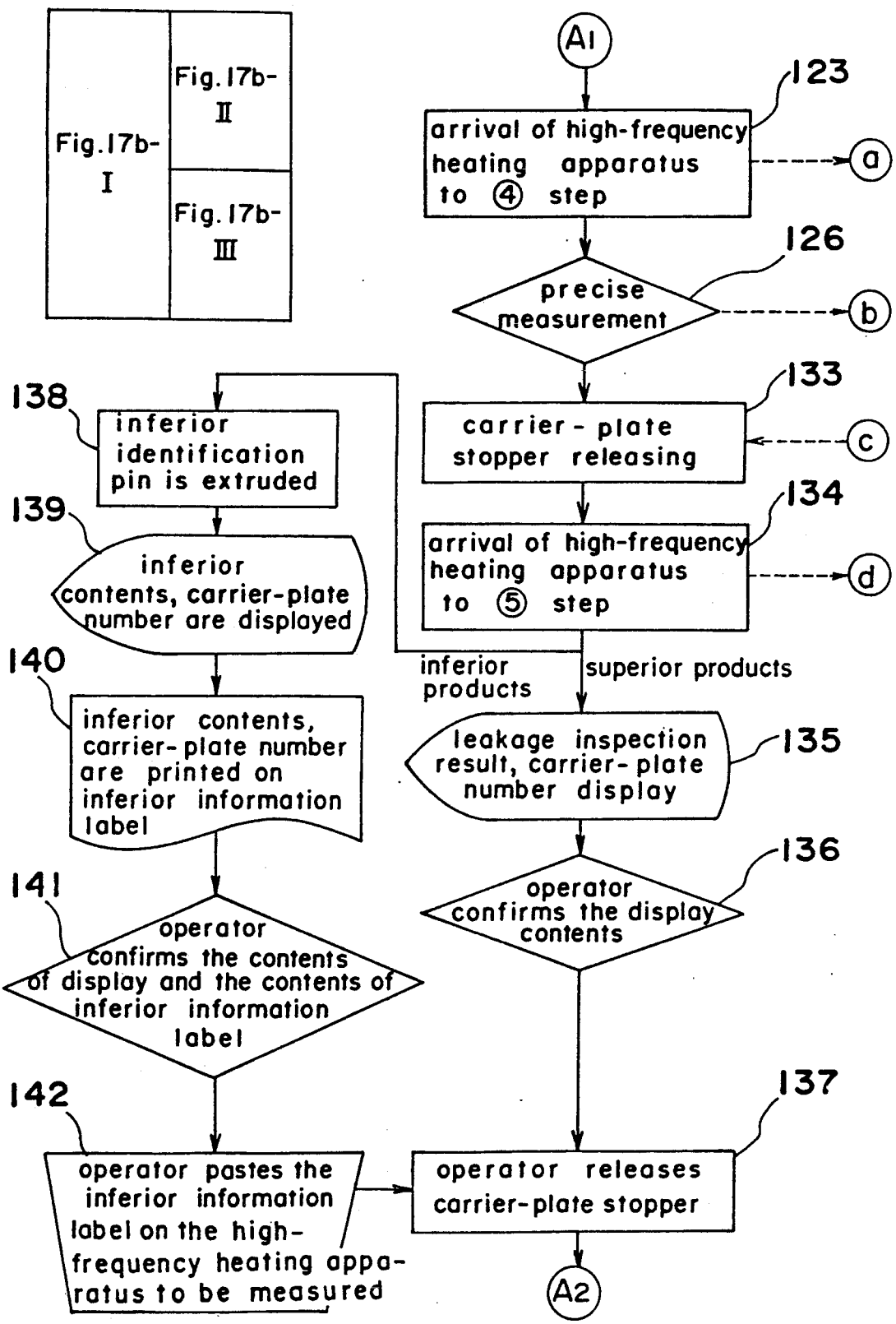

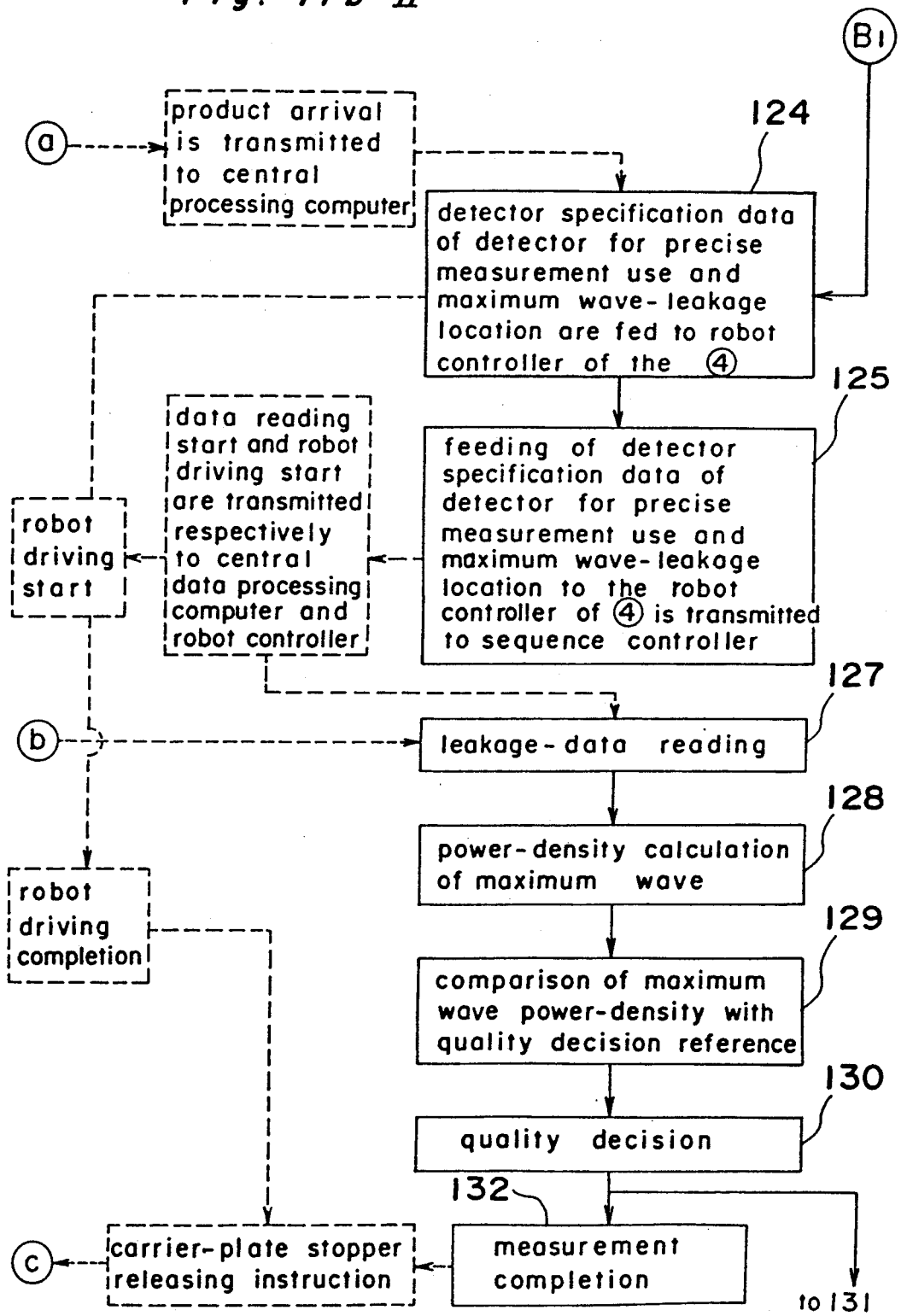

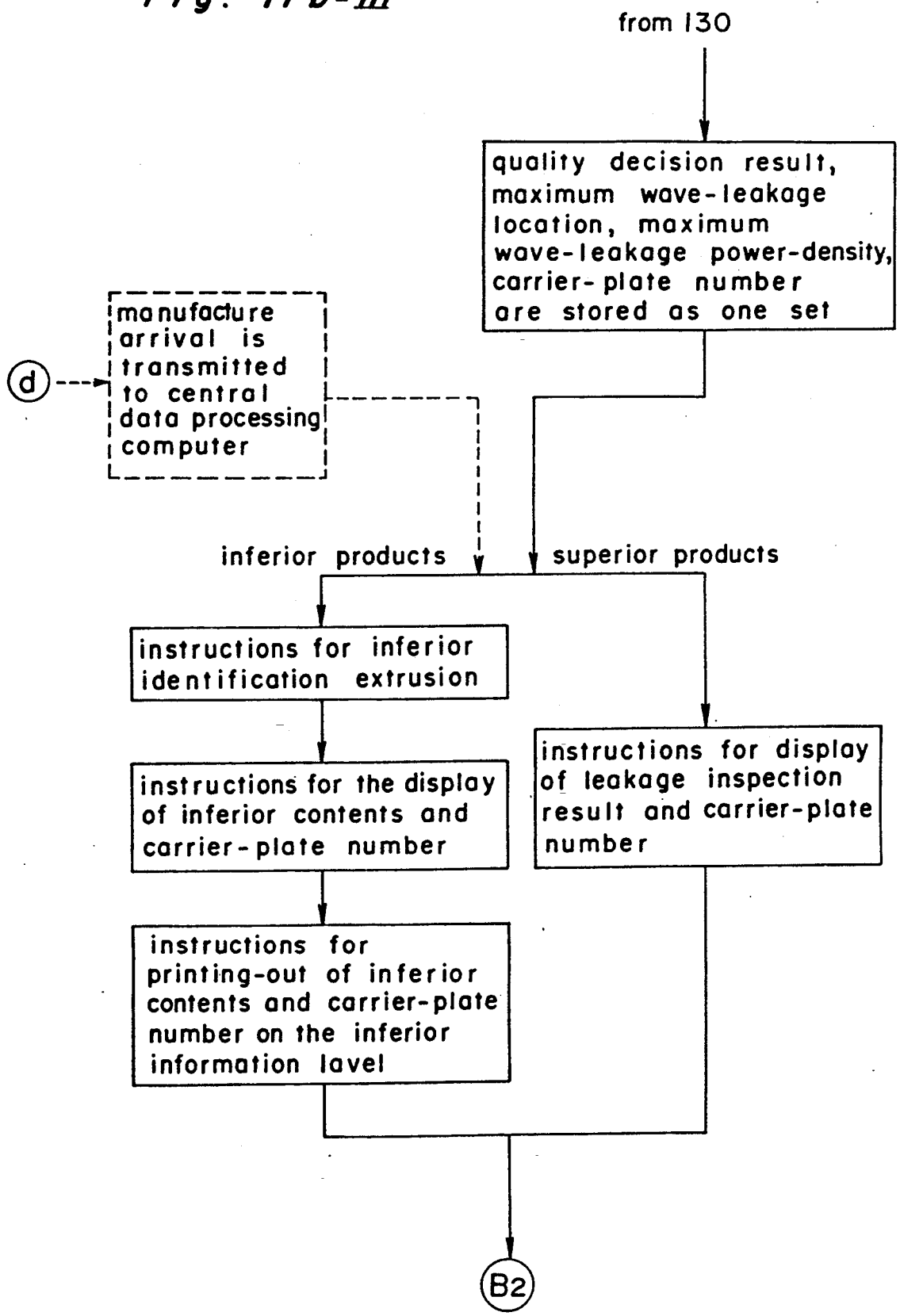
Fig. 17b-III

Fig. 17c-I

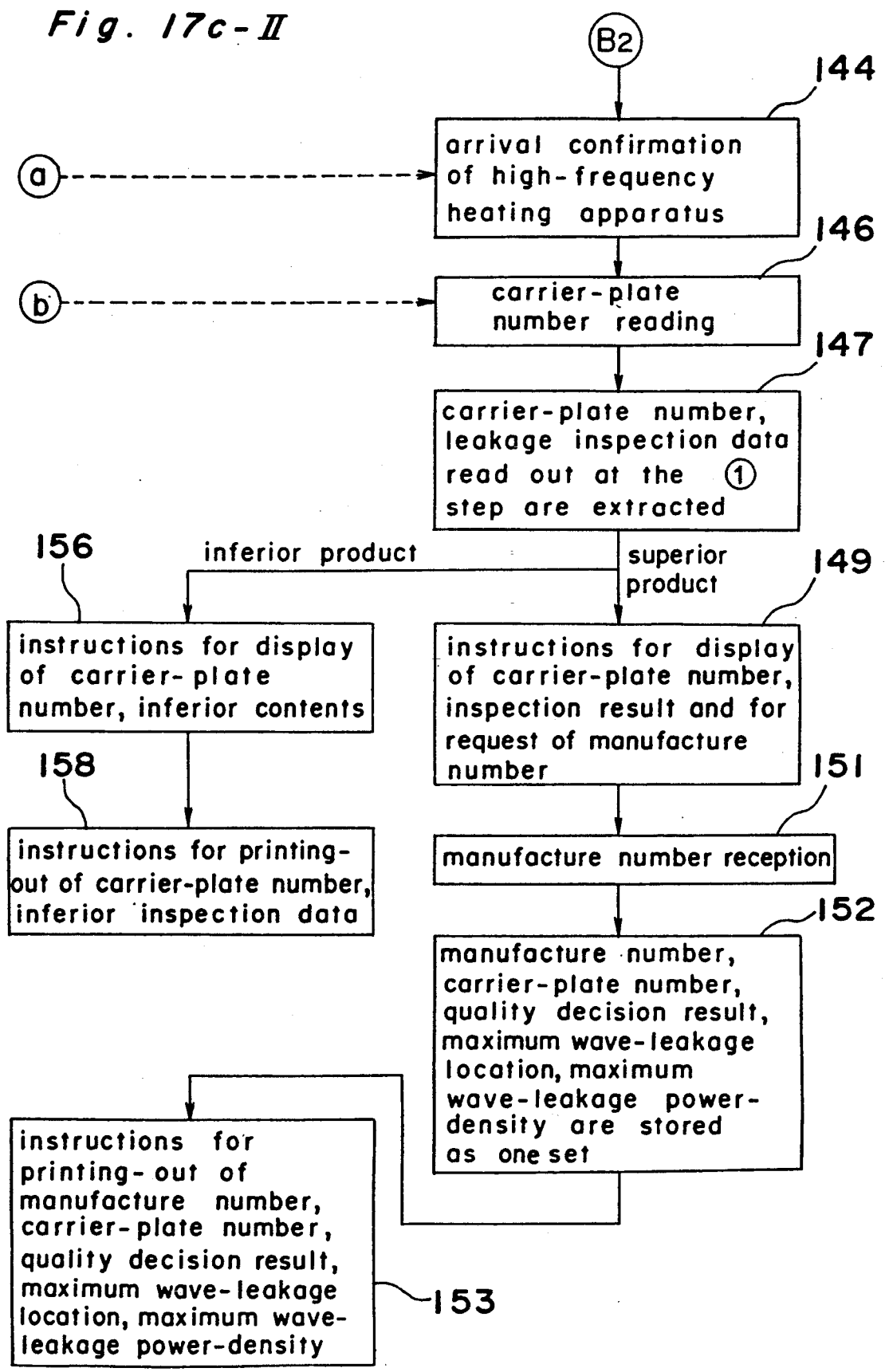
Fig. 17c-II

WAVE-LEAKAGE MEASURING APPARATUS AND MEASURING METHOD

This application is a continuation of now abandoned application, Ser. No. 07/318,424 filed on Mar. 1, 1989, which was a continuation of now abandoned application, Ser. No. 07/029,223, filed Mar. 23, 1987.

BACKGROUND OF THE INVENTION

The present invention relates to an electromagnetic leakage measuring apparatus and its measuring method for measuring the power density of the leakage the electric-waves from the electronic range in the production process of electric-wave application appliances such as high-frequency heating apparatus and so on.

Generally, the power density of the leakage waves from the periphery of the door on the high-frequency heating apparatus is different in its value depending upon the size between the door inner-face shown in FIG. 1, and FIGS. 2(A) and 2(B) and the door doubling plate 2. The portion which is normally large in the gap becomes smaller. Accordingly, the pattern in the power density of the leakage waves on the entire periphery of the door of the high-frequency heating apparatus is provided in, for example, in FIG. 2(B) if the square portions of the door are A through D in FIG. 2(A).

Also, the power density of the leakage waves from the periphery of the door on the high-frequency heating apparatus momentarily changes through the rotation angle of such a wave mode converting apparatus 3 as a rotary metallic blade shown in FIG. 1. The change is repeated, with one rotation of the electric-wave agitating apparatus 3 being provided as one period, even in the same location as shown in FIG. 3. This is the same as the apparatus which is provided with such a wave mode converting apparatus as a so-called rotation antenna with the wave-feed portion being rotated at a constant period or a so-called turntable system with the food is placed and rotated. Accordingly, it is measured whether or not the power density of the leakage waves from the periphery of the door of the high-frequency heating apparatus stays within the fixed reference. Two methods shown are adapted as the measuring method to perform the deciding operation.

As shown in FIG. 4, in the first method, grasp the handle 5a of a power-density detector 5 connected with a power-density measuring apparatus 4 for portable use to get the tip end thereof closer to the periphery of the door of the high-frequency heating apparatus to seek the largest wave-leakage locations while sweeping along each side on the entire periphery of the door 6 of the high-frequency heating apparatus at a slow speed. And the same wave-leakage detector 5 is fixed to that location while the wave mode 7 of the electronic range makes at least one rotation. During this period, the maximum value of the power density to be displayed on the power density measuring apparatus 4 for portable use is read. The inspector decides whether or not the value stays within the regulated reference. Also, in the second method, the inspector of the first method sweeps the power-density detector 5 and reads the power density, and a robot and computer perform the function of judging the quality as to the power density of the leakage wave. The automatic wave-leakage measuring apparatus is shown in FIG. 5. In this method, a plurality of power density detector 8 is brought closer onto the periphery of the door of the high-frequency heating apparatus 9 by the robot to perform the sweeping operation at a slow speed in the horizontal direction or the vertical direction. The computer (not shown) detects the sweeping location of the power density detector 8 which has detected the largest value from among the power densities detected by the plurality of power density detectors 8, and its value is automatically judged, by the computer, with respect to the wave-leakage.

However, in the first method, the uniformity was removed in the measurement, deflection was caused by the inspector's dispersed operation tie, the method of measurement and so on, so that the inspection accuracy was lowered, the measurement time became uncertain so as to lower the productivity. Also, the method by the second automatic wave-leakage measuring apparatus considerably improves the defect of the first method to have large effects in the measuring accuracy improvement and the measurement time uniformity. However, such an automatic wave-leakage measuring apparatus as developed at the present time can be applied only to the measurement of the power density of the leakage waves from the high-frequency heating apparatus, which has a wave mode converting apparatus having a rotational speed of about 60 or more revolutions per minute. Namely, as shown in FIG. 6(A), when the rotational speed of the wave mode converting apparatus of the high-frequency heating apparatus is 60 revolutions or more per minute, in other words, one revolution or more per second, the period of the power density of the leakage waves by the rotation becomes one second or less, the maximum value of the power density of the leakage waves within one period is caused at the rate of one per second or less. Thus, if the power-density detector is swept at a faster speed on the door periphery of the high-frequency heating apparatus, the maximum power density by the rotation of the wave mode converting apparatus shows itself one after another in all the locations, so that the maximum value may be caught at any location. Since the time of one period is one second or less, one second or less will do when the power-density detector is secured at the maximum leakage location. As a result, it is possible to measure the power density of the leakage waves through equal-speed the sweeping operation by the power-density detector. The sweeping speed of the power-density detector in this case is performed formed at about 2.5 cm per second.

However, in recent years, the system of the wave-mode converting apparatus of the high-frequency heating apparatus is vaned. In particular, some wave-mode converting apparatuses are developed which have six revolutions per minute. The power density of the leakage waves from the electronic range which has the wave-mode converting apparatus such a slow rotational speed as described hereinabove becomes ten seconds in the period with the wave-leakage amount in the same position being momentarily changed through the rotation angle of the wave-mode converting apparatus as shown in FIG. 6(B). If the power-density detecting appliance is swept at a speed of, for example, 2.5 cm per second when the wave-mode converting apparatus is slow, the power density detector 25 cm (2.5 cm per second×10 seconds) is swept from the first maximum value to the next maximum value with the result that the sweeping operation has been swept without the detection of the maximum value for 25 cm. It can not be said that the measuring operation has been correctly performed. Accordingly, for the precise measurement, the sweeping speed of the power density detector is required to be made as slow as, for example, about 3 mm per second. However, the sweeping operation on the entire periphery of the door of the high-frequency heating apparatus with the sweeping speed being 3 mm per second causes a problem that the inspection time per high-frequency heating apparatus becomes very long, the productivity in the mass-production process of the high-frequency heating apparatus is considerably reduced.

When the number of power-density detectors is increased, the established interval is made shorter, and it is considered that the sweeping distance per power-density detector becomes shorter, the inspection time per electronic range becomes shorter even if the sweeping speed of the power-density detector is slow. However, when the space between the power-density detectors becomes smaller, they interfere with each other so that the power density can not be correctly detected.

SUMMARY OF THE INVENTION

Accordingly, an object of the present invention is to provide a first power-density detector which is adapted to sweep along the periphery of the door of the high-frequency heating apparatus.

Another object of the present invention is to provide a second power-density detector which is adapted to measure the power density of the biggest wave-leakage location detected by the first power-density detector.

A high-frequency heating apparatus, whose largest wave-leakage location is detected by the first power-density detector fastest in the sweeping speed may perform the detecting operation in accordance with the rotational period of the wave-mode converting apparatus of the high-frequency heating apparatus by the second power-density detector, so that the maximum power density in the maximum wave-leakage location may be correctly detected in the shortest time. One high-frequency heating apparatus is detected by the second power-density detector and simultaneously the other high-frequency heating apparatus is adapted to be detected by the first power density detector, so that the detection is performed with the best efficiency.

BRIEF DESCRIPTION OF THE DRAWINGS

These and other objects and features of the present invention become apparent from the following description taken in conjunction with the preferred embodiment thereof with reference to the accompanying drawings, in which:

FIGS. 17a–17c, which respectively comprise FIGS. 17aI–17aIII and FIGS. 17bI–17bIII and FIGS. 17c–17cII, together form a flow chart showing the measuring method.

DETAILED DESCRIPTION OF THE INVENTION

Figure 1:
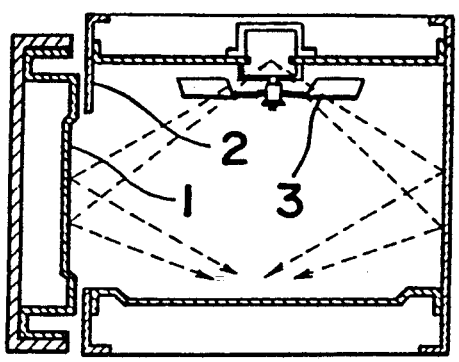
FIG. 1 is a sectional view of the general high-frequency heating apparatus.
Figure 2A:
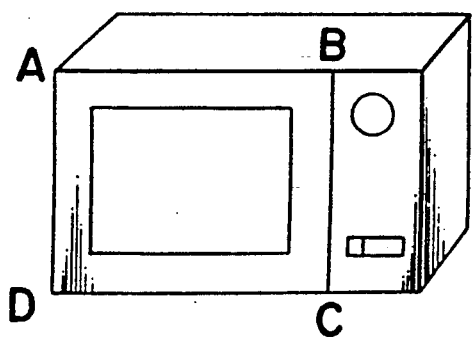
FIGS. 2(A) and 2(B) are illustrating views showing the power density of the leakage waves from the door.
Figure 2B:
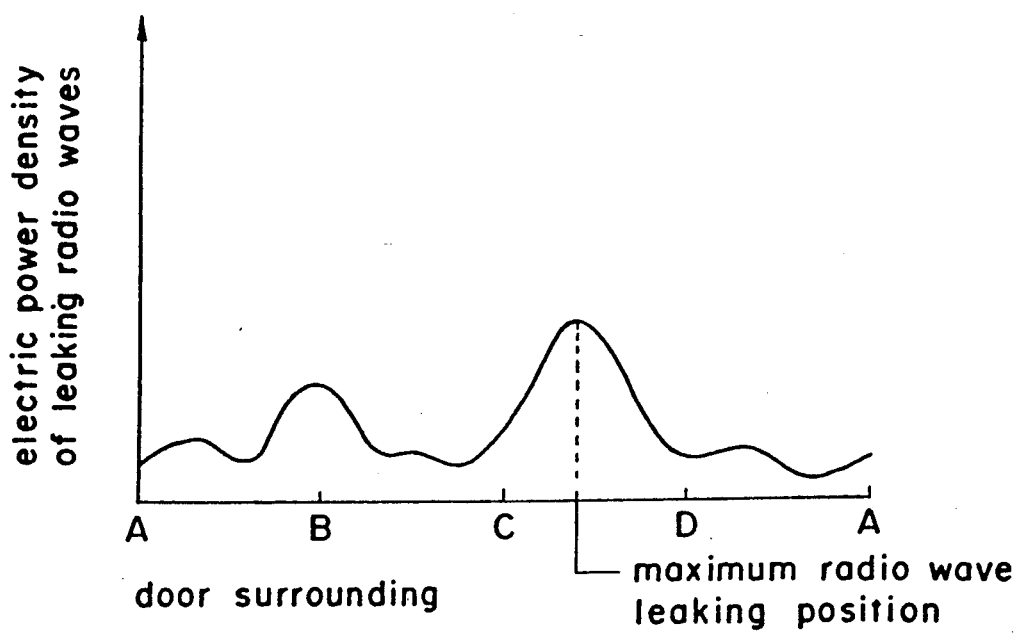
Figure 3:
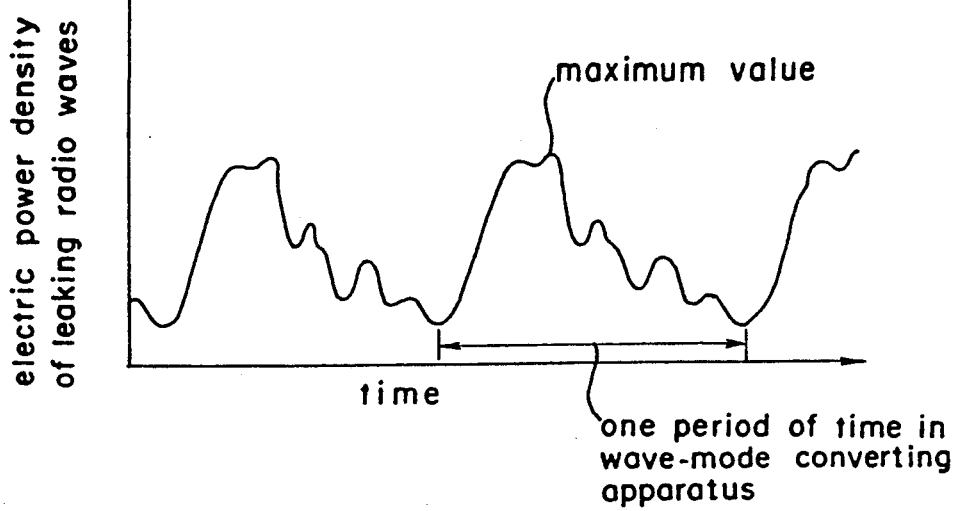
FIG. 3 is the waveform chart showing the power density of the leakage waves from the door through the rotation of the wave-mode converting apparatus.
Figure 4:
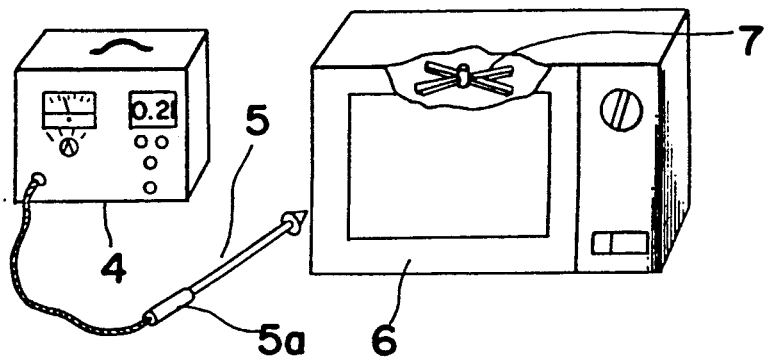
FIG. 4 is a perspective view showing the conventional method of measuring the power density of the leakage waves.
Figure 5:
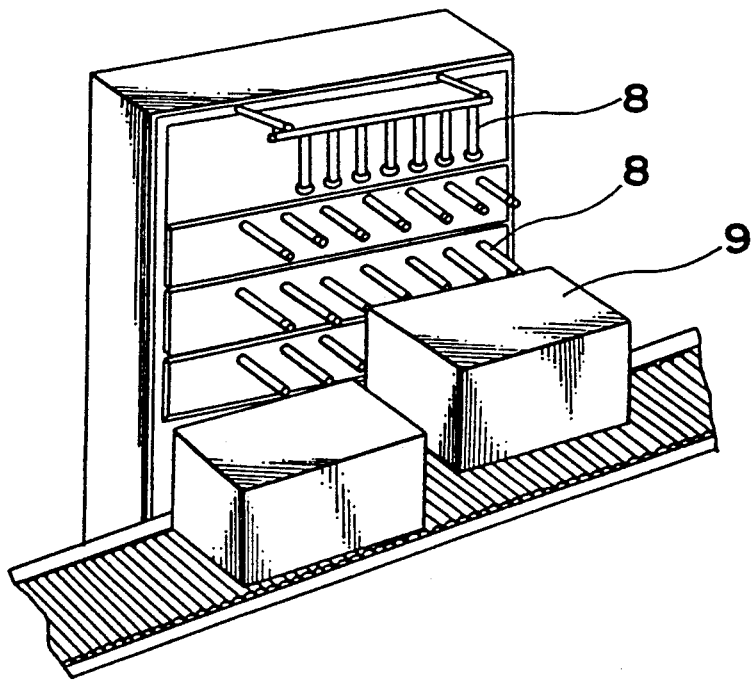
FIG. 5 is a perspective view showing another conventional method of measuring the power density of the leakage waves.
Figure 6A:
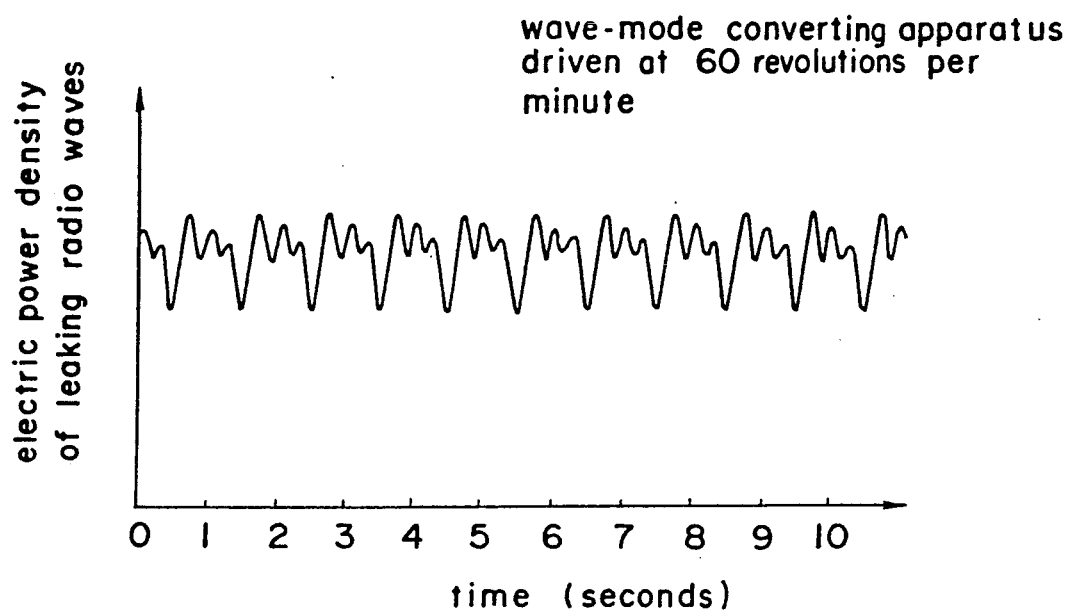
FIGS. 6(A) and 6(B) are waveform charts showing the power density of the leakage waves through the rotation of the wave-mode converting apparatus.
Figure 6B:
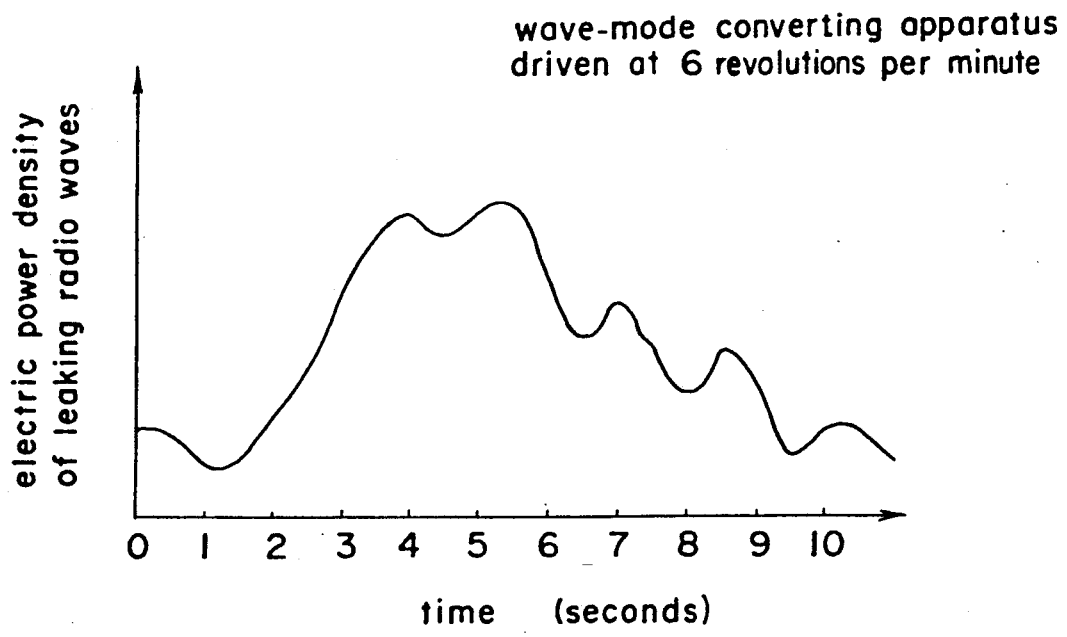

Before the description of the present invention proceeds, it is to be noted that like parts are designated by like reference numerals throughout the accompanying drawings.

Figure 7:
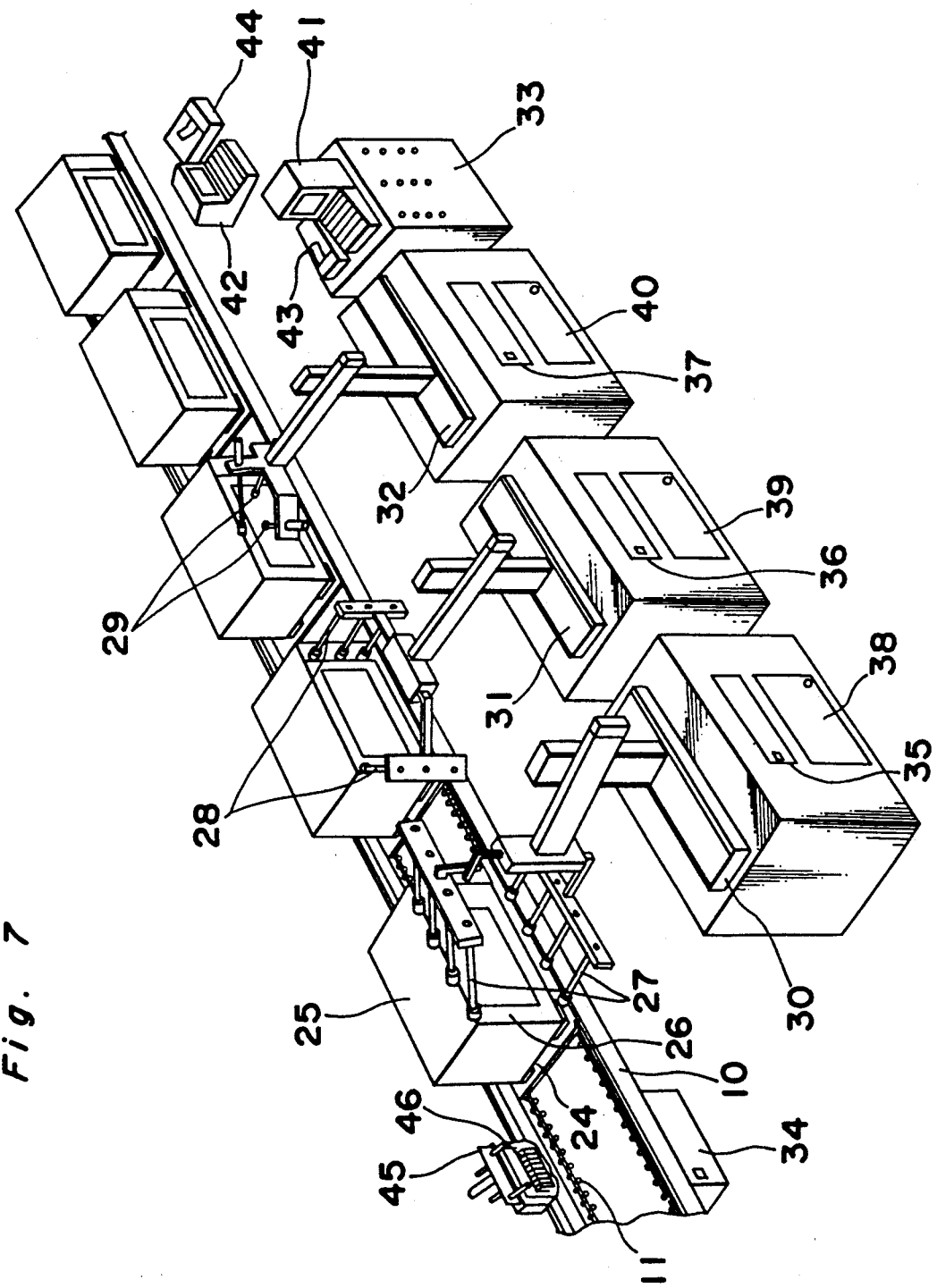
FIG. 7 is a perspective view of the wave-leakage measuring apparatus in one embodiment of the present invention.
Figure 8:
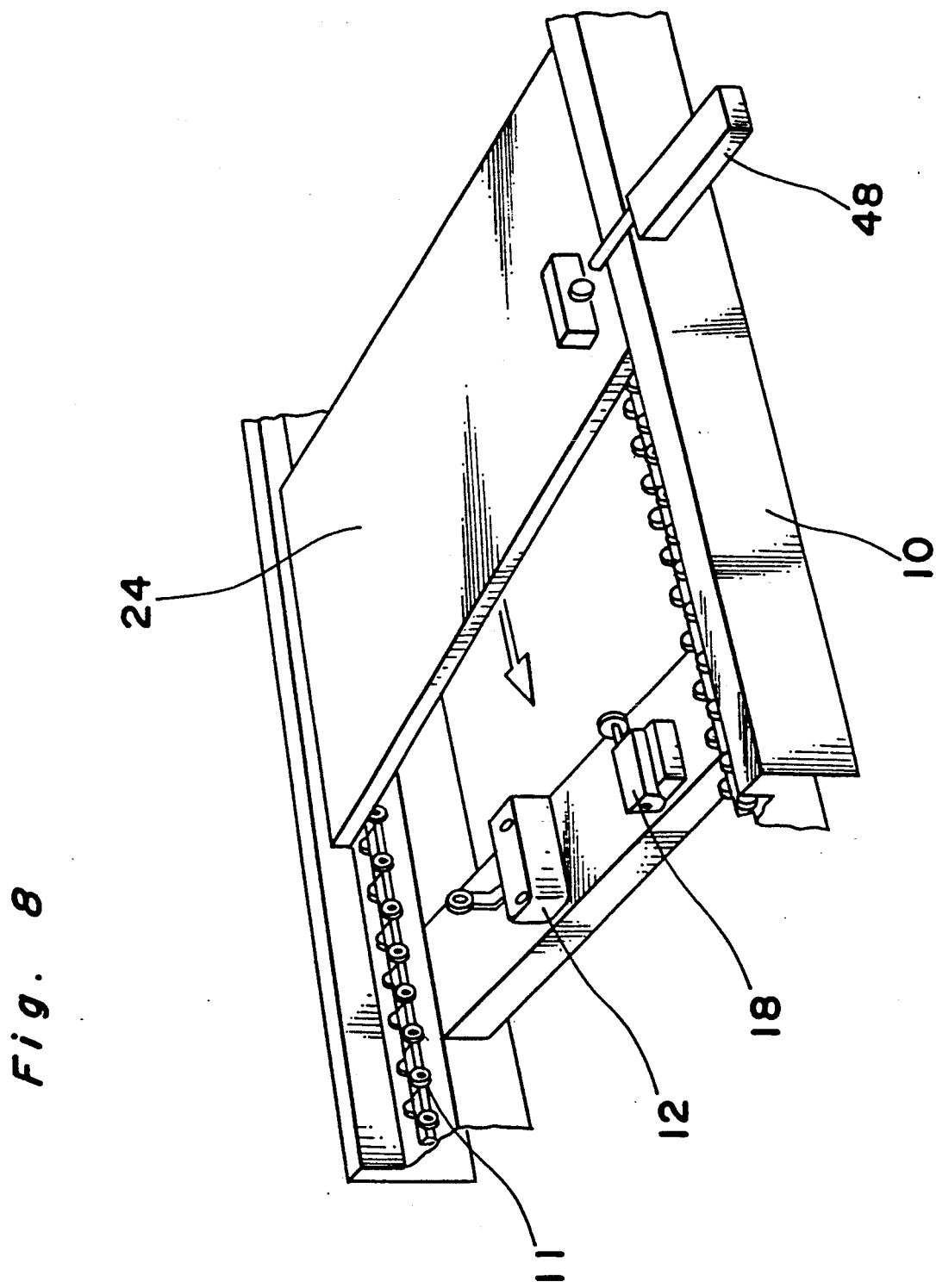
FIG. 8 is a perspective view of the essential portions.
Figure 9:
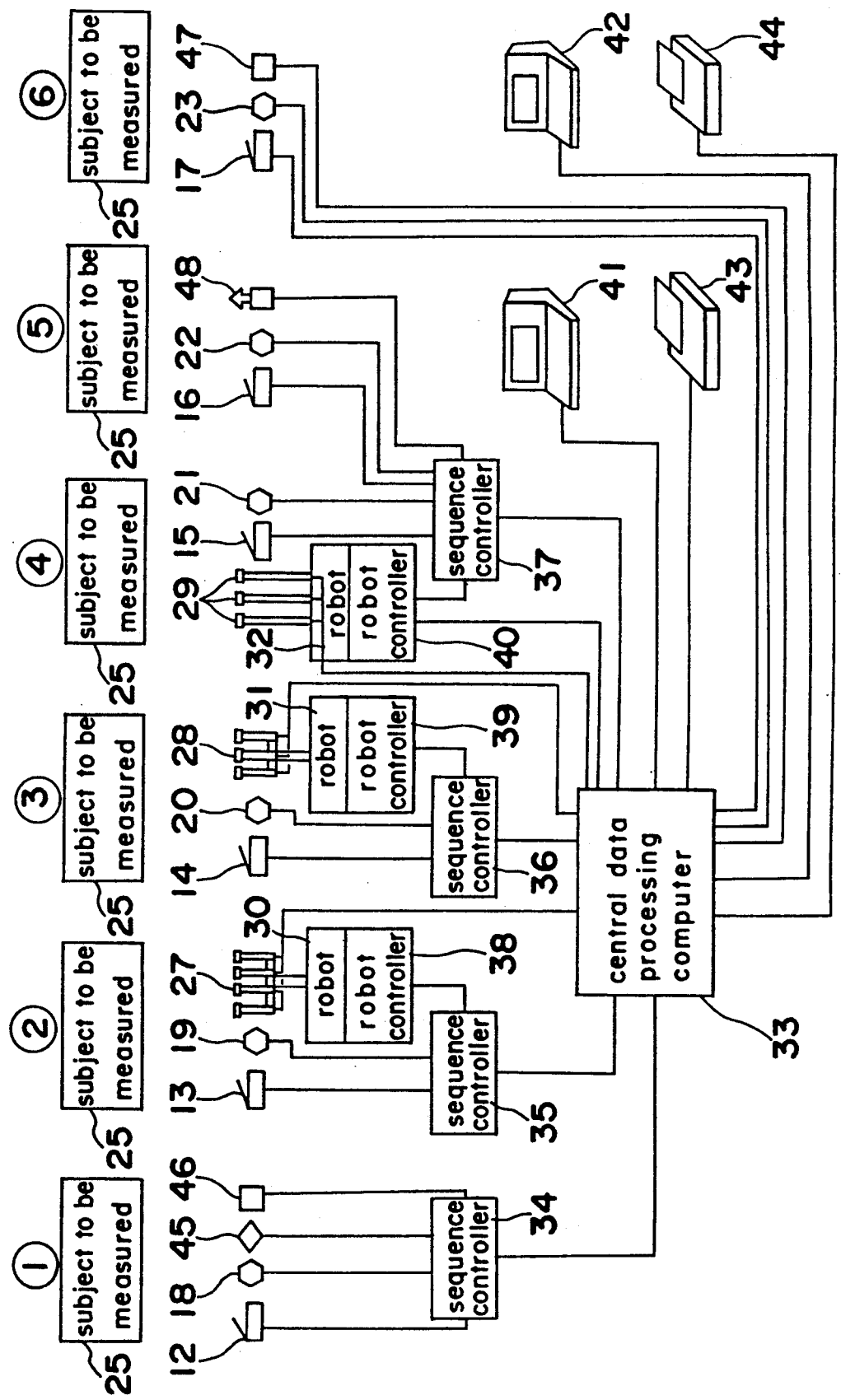
FIG. 9 is a block diagram showing the entire construction.

Referring now to the drawings, there is shown in one embodiment a wave-leakage measuring apparatus in accordance with the present invention. The first power-density detector is composed of a horizontal-direction detector which detects the horizontal portion of the door of the high-frequency heating apparatus and a vertical-direction detector which detects the vertical portion of the door, the horizontal-direction detector and the vertical-direction detector are respectively composed of a plurality of detectors. Namely, as shown in FIG. 7 through FIG. 9, in the wave-leakage measuring apparatus in the present embodiment, the high-frequency heating apparatus 25 flowing on the conveyer 10 is measured by the horizontal-direction detector 27 so as to seek the maximum wave-leakage location of the horizontal portion of the door 26 of the high-frequency heating apparatus 25. Then, the high-frequency heating apparatus 25 is measured by the vertical-direction detector 28 to seek the maximum wave-leakage location of the vertical portion of the door 26. And the data as to the power density of the leakage waves measured by the horizontal-direction detector 27 and the vertical-direction detector 28, and its measuring location are stored in the central data-processing computer 33 for calculation, so that the maximum wave-leakage location on the entire periphery of the high-frequency heating apparatus 25 is selected. The high-frequency heating apparatus 25 where the maximum wave-leakage location has been selected by the central data-processing computer 33 is measured by a detector 29 for precise measurement use, the second power-density detector, in the power density of the leakage waves in the maximum wave-leakage location. The safety of the high-frequency heating apparatus is confirmed by the measured power density.

A conveyer 10 will be described hereinafter in accordance with FIG. 7 and FIG. 9. The high-frequency heating apparatus 25 to be measured by a carrier conveyer 10 is moved through the driving operation, by a driving motor (not shown), of the roller chain 11, which comes into direct contact against the bottom face on the carrier plate 24 with the high-frequency heating apparatus 25 to be measured being placed thereon. The measuring method is composed of the following steps, which are ① a step where a position detecting apparatus 45 and a carrier-plate-number reading apparatus 46 are disposed on the high-frequency heating apparatus 25 to be measured, ② a step for detecting the maximum wave-leakage location by the horizontal-direction detector 27, ③ a step for detecting the maximum wave-leakage location by the vertical-direction detector 28, ④ a step for measuring the power density of the leakage wave in the maximum wave-leakage location by the detector for precise measurement use, ⑤ a step for displaying the operation sequence, failure or the like of the present apparatus by the display 41, for printing out the failure contents by the printer 41, ⑥ a step for displaying the manufacture number, the carrier-plate number by the display 42, for printing out the measurement data by the printer 44. Also, there are carrier-plate arrival sensors 12, 13, 14, 15, 16 and 17 for detecting the arrival of the carrier plate 24 at the given location in the respective steps in order to perform the stopping operation in or the new moving operation into the given position of the conveyer 10 in the respective steps, and stopper apparatuses 18, 19, 20, 21, 22 and 23 for stopping the high-frequency heating apparatus 25 at the given position. In addition, sequence controllers 34, 35, 36, and 37 are provided for performing the start, the stop and the timing control of these apparatuses, or for performing the communication and the timing control among these apparatuses, and the robot controllers 38, 39, 40, and among the robot controllers 38, 39, and 40 and the control data processing computer 33. The operations of the apparatuses are controlled by the sequence controllers 34, 35, 36, 37 to stop the high-frequency heating apparatus 25 to be measured at the given position of the conveyer 10 in the respective steps or to feed it into the next step without stopping the driving operation of the roller chain 11 of the conveyer 10.

Figure 10:
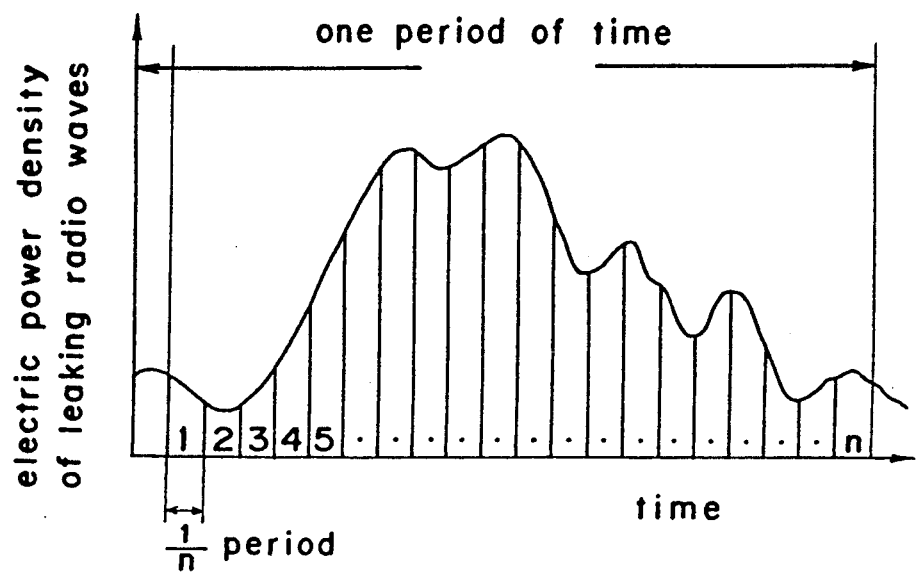
FIG. 10 is a waveform chart showing the sweeping speed of the detector.
Figure 11:
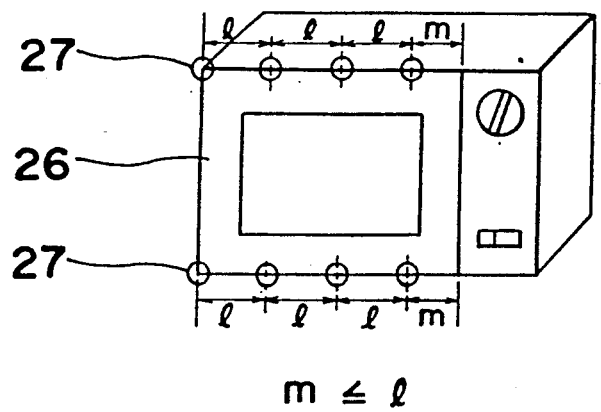
FIG. 11 and FIG. 12 are perspective views showing the arrangement of the detector.
Figure 12:
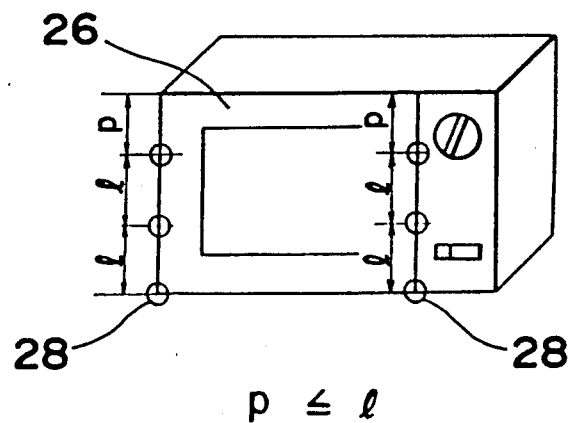

Each of the sensors 27, 28, 29 will be described hereinafter in detail. At first, in the horizontal-direction detector 27 and the vertical-direction detector 28, all the plural power-density detectors are simultaneously swept at very fast speeds by the robots 30 and 31. Namely, as shown in FIG. 10, one period of the wave-mode converting apparatus is equally divided by n, the power-density detector is swept from one end of the door 26 of the high-frequency heating apparatus 25 to the other end thereof at the time of one period per n, so that the power density of the leakage waves is measured while the changes in the power density of the leakage waves accompanied by the rotation of the wave agitating apparatus are very small. However, as the time point where the maximum value within one period appears is different depending upon the time point where the sweeping operation of the power-density detector begins, the power-density detector is swept by n time from one end of the door 26 of the high-frequency heating apparatus to the other end, because the power-density detector is swept while the maximum value of one period appears without fail. Namely, the sweeping operation is continuously swept while the wave-mode converting apparatus makes at least one circuit. As the power-density detector is swept by n times in the wave-leakage measuring apparatus of the present invention, it goes to and fro to perform the sweeping operation along the vicinity of the door 26. The sweeping operation of one power-density detector at the time of one period per n from one end of the door 26 to the other end is required to be very quickly performed, because the length of one side of the door 26 of the general high-frequency heating apparatus 25 is about 40 cm long. Thus, the fast sweeping operation is likely to cause the mechanical damages of the sweeping mechanism itself. As a measure against the damage, a plurality of power-density detectors 27 and 28 are arranged in equal intervals at the pitch of the length l along the side of the door 26 as shown in FIG. 11 and FIG. 12. This system is provided of sweeping the plurality of power-density detectors 27 and 28 for the distance of l at the same time to equivalently sweep from one end of the door to the other end.

The power density of the four-side leakage waves of the door 26 is measured during the above-described sweeping period, the measurement values and the respective leakage locations are temporarily stored in the central data processing computer.

Comparisons are made for the largest power density within the central data processing computer, so that one of the maximum wave-leakage locations is selected. The selected maximum wave-leakage location is automatically inputted into the robot roller 40 of the robot 32 which operates the following detector 29 for the precise measurement use.

The robot 32 brings one of the detectors 29 for precise measurement use among three detectors closer to the maximum wave-leakage location in accordance with the maximum wave-leakage location inputted in the robot controller 40 to come to rest while the predetermined wave-mode converting apparatus makes at least one rotation for the precise measurement of the power density of the leakage waves. The value is compared with the quality deciding reference of the power density of the leakage waves by the central data processing computer so that the quality is automatically decided. The above-described steps are arranged in series along the carrier conveyer 10 of the high-frequency heating apparatus 25 so that the measurement of the power density of the leakage waves per unit of the high-frequency heating apparatus 25 is adapted to be performed for a short time equivalent to one rotation of the wave-mode converting apparatus.

The use of the detectors 27 and 28 results in errors with respect to the absolute values of the power density since the response time of the detectors 27, 28 is required to be made faster due to the fast sweeping speed. Accordingly, a quality decision of the wave-leakage has to be performed taking such errors into consideration, thus resulting in a stricter quality deciding reference of inspection than is necessary, which increases the inspection cost. Accordingly, in order to remove this problem, the detectors 27 and 28 operate to measure only the relative values of the power density to detect the maximum wave-leakage location. The quality decision of the power density in the maximum wave-leakage is adapted to be performed through the measurement of the absolute value of the power density by a detector 29 for precise measurement use, having the response time switch is almost as slow as the response time of the measuring apparatus which is used in the sweeping operation of the detection apparatus as in the conventional measuring method.

Figure 13:
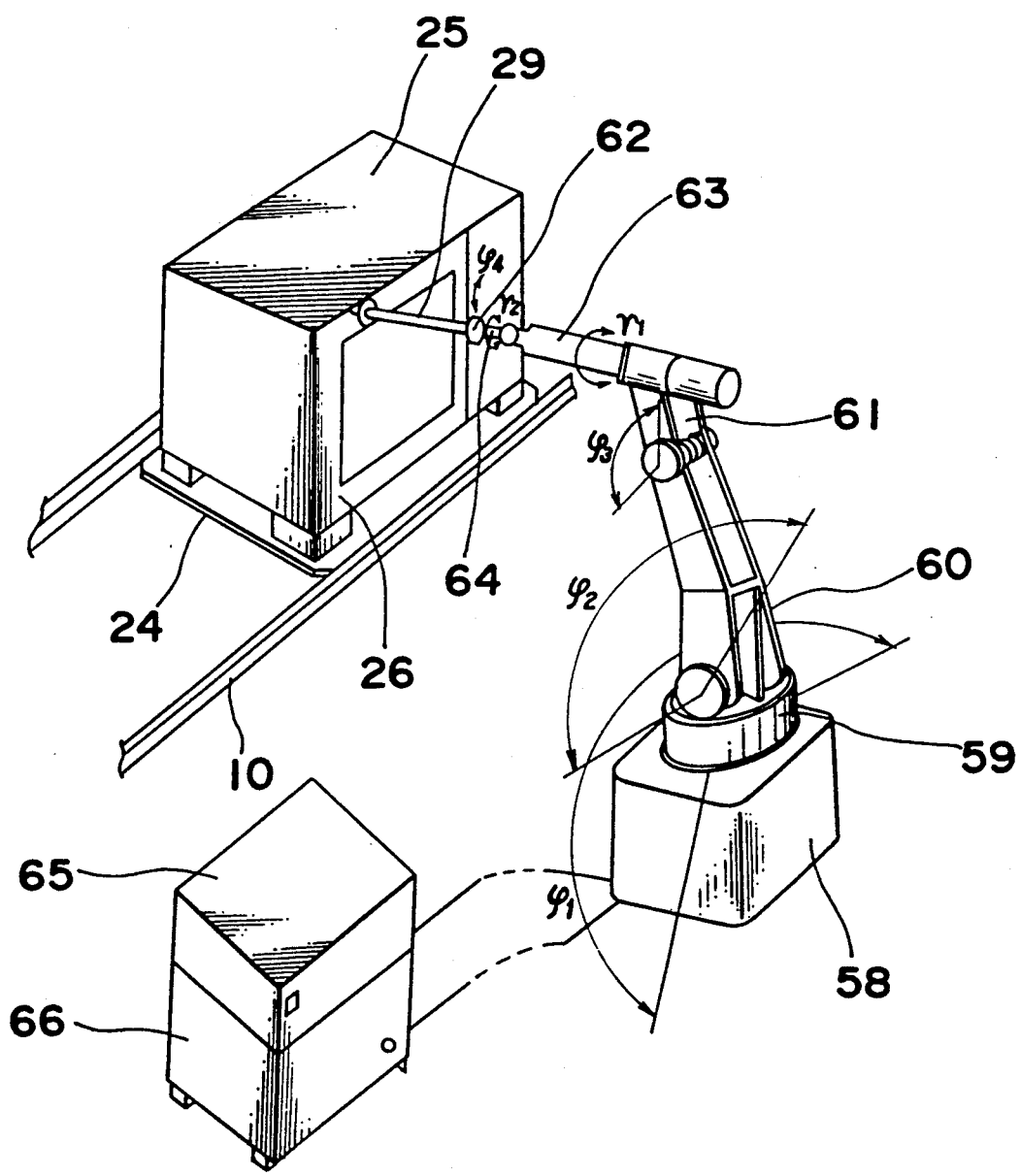
FIG. 13 through FIG. 16 are respectively perspective views of the robots for driving the detector.

Also, although the second power-density detector may measure across the entire periphery of the door 26 of the high-frequency heating apparatus 25 to be measured with the use of one detector only in a case where it may be brought closer at the same angle with respect to either of right, left, upper, lower sides of the door 26 of the high-frequency heating apparatus 25 to be measured. When the measurement is performed with one detector only in such a case, the proximity angle of the detector may be automatically varied. It may be possible if such a multiple articulated robot 58 as in FIG. 13 is used. However, the multiple articulated robot 58 is extremely high in price at the present time, so that the cost effect becomes extremely small when it is used in the present measuring apparatus. Accordingly, in order to solve the problem, three detectors are used as the second power-density detector in the present embodiment, are engaged with the robot 32 at a predetermined angle in accordance with the side of the door 26 to be brought closer. One detector corresponding to it is selected by the side of the door 26 where the maximum wave-leakage location has been detected to have it closer to the maximum wave-leakage location. In the present embodiment, one detector is adapted to be used with respect to the left side of the door 26, one detector with respect to the upper side of the door 12, one detector to be used in common with respect to two sides, the lower side and the right side, of the door 26. Also, the display 41 shown in FIG. 7 shows the operation sequence of the present apparatus, the information (failure causes) during the trouble, and the inspection result report (superior product, defective product, defect or the like) to notify the apparatus operator of it.

Also, the printer 43 prints out the defective information when the high-frequency heating apparatus 25 has become defective through the wave leakage inspection of the present apparatus. It is to be noted that the defective information printed out are pasted on the respective defective high-frequency heating apparatuses, by the operator of the steps, as the defective information label. Also, the defective identification pin of the carrier plate 24 of the high-frequency heating apparatus, which has become defective though the wave leakage inspection of the present measuring apparatus is automatically operated at this step by the defective identification pin extruding apparatus 48 shown in FIG. 8 to automatically direct the defective high-frequency apparatus to the repair step.

Also, the display 42 displays the inspection result and the carrier-plate number of the high-frequency heating apparatus 25 which has arrived at this step to notify the step operator whether or not the manufacture number should be given to him.

Also, the printer 44 prints out the inspection result and the inspection data through the present measuring apparatus of the individual high-frequency heating apparatus 25.

The position detecting apparatus 45 shown in FIG. 7 is an apparatus for detecting the position shift, which is caused in a case where the high-frequency heating apparatus 25 to be measured is not disposed in the regular location of the carrier plate 24. Unless the high-frequency heating apparatus 25 to be measured is correctly disposed, the high-frequency heating apparatus 25 is adapted not to flow into the step of the wave-leakage measuring apparatus.

The carrier-plate number reading apparatus 46 is a reader for automatically reading the carrier-plate number given to the respective carrier plate. The carrier-plate numbers read in here are fed into the central data processing computer 33. The carrier-plate number, the maximum wave-leakage location of the high-frequency heating apparatus to be measured which has been disposed on the carrier plate 24, the power density of the leakage waves of the portion are provided in a pair. In a step where the manufacture number is given to the high-frequency apparatus to be measured, the carrier-plate number is read again by the carrier-plate number reading apparatus 47, is inputted out into the central data processing computer 33 as the pair to the manufacture number. Finally, the carrier-plate number, the manufacture number, the maximum wave-leakage location, the power density of the leakage wave are memorized as a set.

Figure 14:
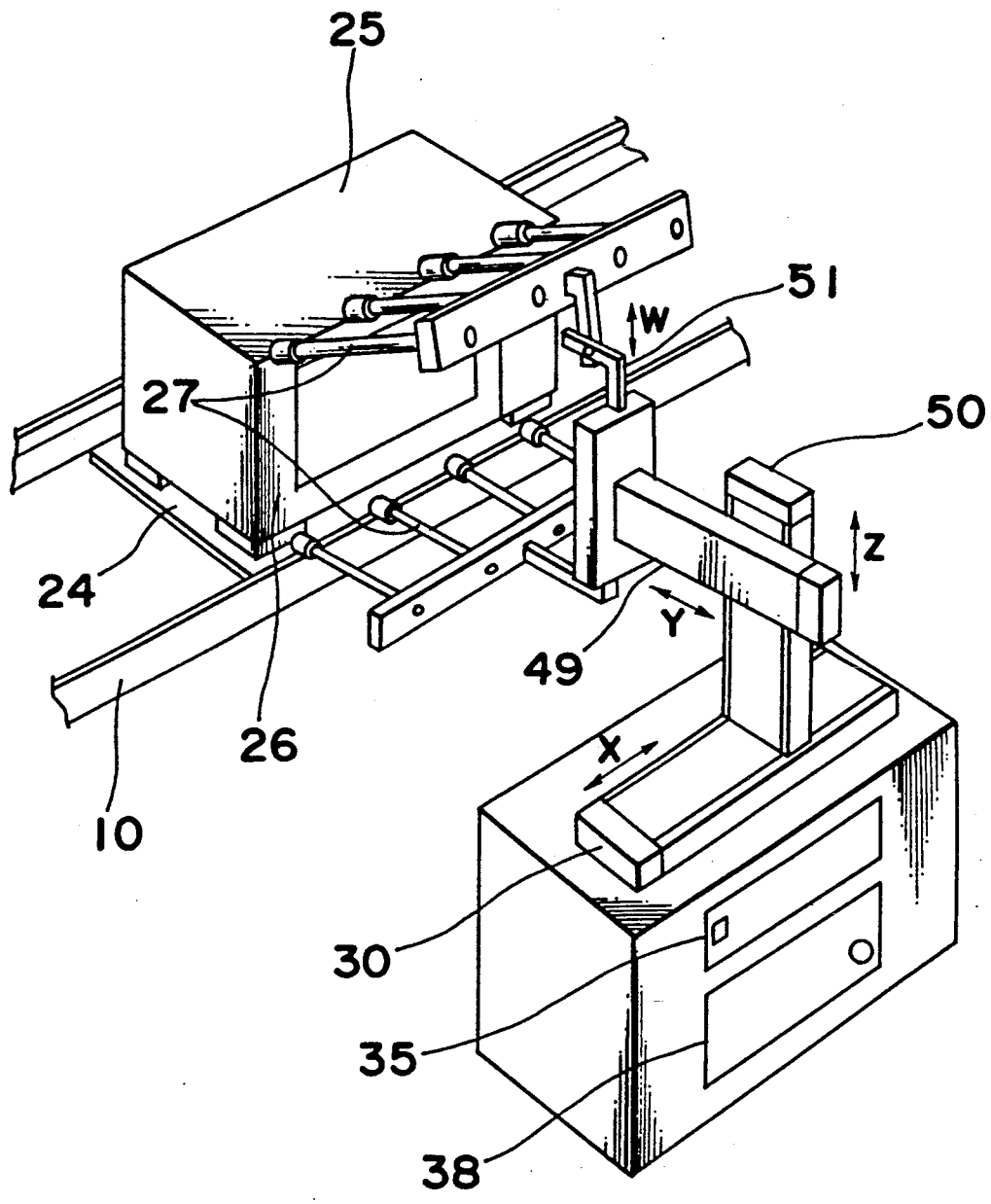

The movement of the robot which is adapted to sweep the power-density detectors 27, 28, and 29 will be described hereinafter. The robot 30 is a driving apparatus for sweeping the horizontal-direction detector 27. The movement of the robot 30 will be described in accordance with FIG. 14.

When the high-frequency heating apparatus 25 to be measured is secured to the given position of the conveyer 10, the driving start of the robot 30 is automatically transmitted from the sequence controller 35 of this step to the robot controller 38 of the robot 30 so that the movable arm 50 automatically moves the horizontal-direction detectors 27 in the X-direction as far as the position where the two upper, lower detectors engaged with on the most left side among the horizontal-direction detectors 27, the first power-density detectors meet the left end of the door 26 of the high-frequency heating apparatus 25 to be measured.

Also, the movable arm 51 moves in the W-direction so that the vertical width of the horizontal-direction detectors 27 may just meet the vertical width of the door 26 of the high-frequency heating apparatus 25.

Then, the movable arm 49 automatically moves the lower-side detectors of the horizontal-direction detectors 27 in the Z-direction to a position where they just meet the lower side of the door 26 of the high-frequency heating apparatus 25 to be measured and simultaneously moves them by the fixed interval in the direction of the Y-direction of high-frequency heating apparatus 25 to be measured to get the horizontal-direction detectors 27 closer towards the periphery of the door 26. Then, the movable arm 50 automatically goes and comes back in the X-direction by the interval, which is equal to the interval 1 between the adjacent detectors of the horizontal-direction detectors 27, and moves at a very fast speed while the wave-mode converting apparatus of the high-frequency heating apparatus 25 to be measured makes at least one rotation.

After the completion of the sweeping operation by the robot 30, the movable arm 49, the movable arm 50, and the movable arm 51 automatically return to the original positions to transmit the sweeping end from the robot controller 38 to the sequence controller 35.

As it is understood in advance that the time required for the wave-mode converting apparatus to make at least one rotation is equal to any high-frequency heating apparatus unless the type of the high-frequency heating apparatus 25 to be measured is not changed, the prescription is performed by the reciprocation sweeping speed of the movable arm 50 in the X-direction, the sweeping distance, the reciprocation frequency.

Accordingly, in order to automatically control the robot 30 for the operation, the distance and speed of the movable arm 49 moving in the Y-direction and in the Z-direction, the moving distance of the movable arm 50 in the X-direction, the reciprocation sweeping distance, the reciprocation sweeping speed, the reciprocation sweeping frequency thereof, and the distance of the movable arm 51 moving in the W-direction are inputted and stored in advance in the robot controller 38 of the robot 30. Also, the variation is adapted to be performed even in a case where the type of the high-frequency heating apparatus 25 to be measured is varied, its outer-appearance size, and the time required for the wave-mode converting apparatus to be rotated vary.

Figure 15:
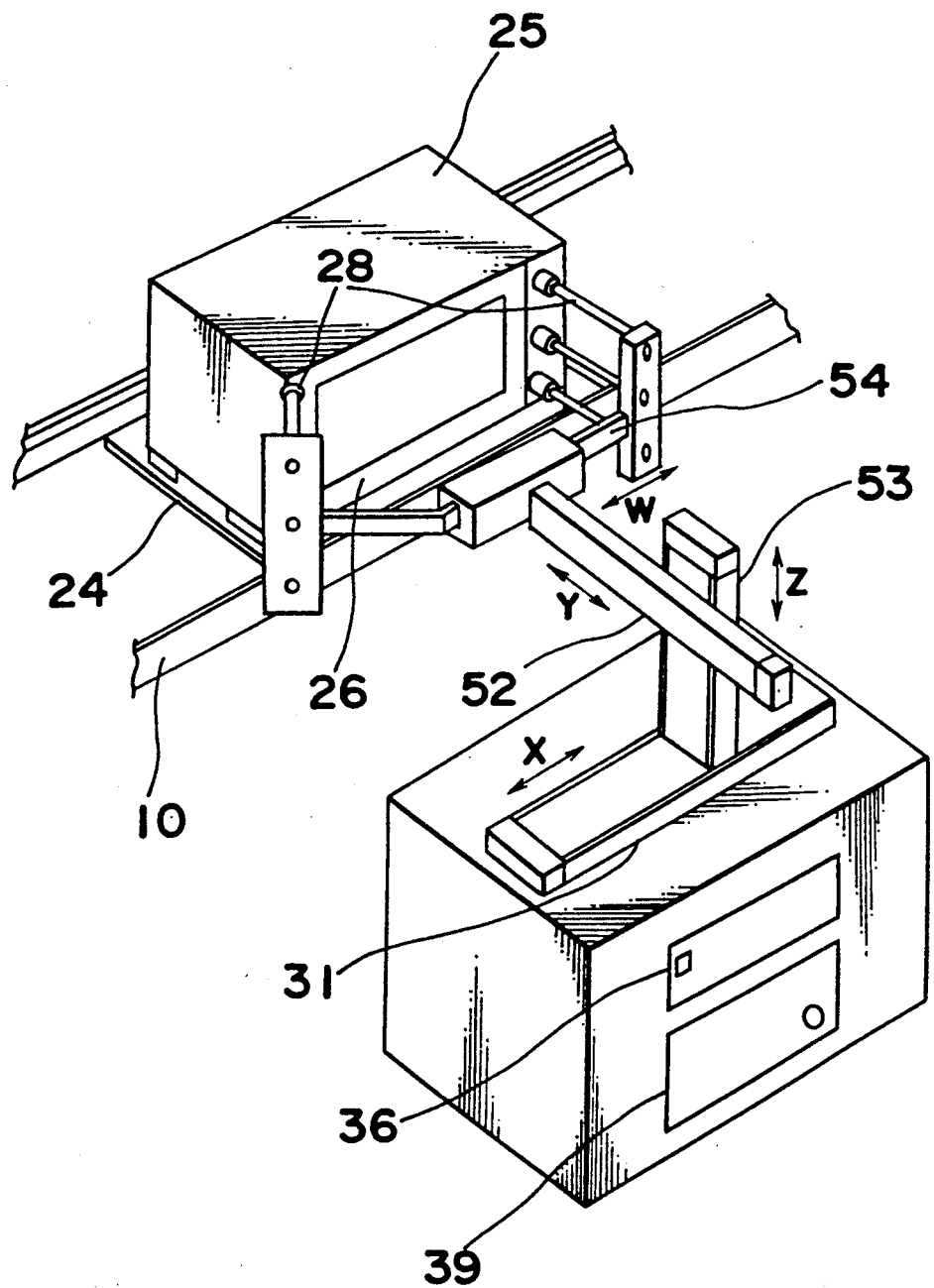

The movement of the robot 31 will be described hereinafter with reference to FIG. 15.

When the high-frequency heating apparatus 25 to be measured is secured to the given position of the conveyer 10, the driving start of the robot 31 is automatically transmitted to the robot controller 39 of the robot 31 from the sequence controller 36 of this step, so that the movable arm 52 automatically moves the vertical-direction detector 28 in the Z-direction to a position where two right, left detectors engaged with on the lowermost side among the vertical-direction detectors 38, i.e., the first power-density detector just meet the lower end of the door 26 of the heating apparatus 25 to be measured.

Also, the movable arm 54 moves in the W-direction so that the right, left width of the vertical direction detector 28 may just meet the right, left width of the door 26 of the high-frequency heating apparatus 25.

Then, the movable arm 53 automatically moves the detector on the left side of the vertical-direction detector 28 in the X-direction to a position where it may just meet the left side of the door 26 of the high-frequency heating apparatus 25 to be measured, and simultaneously moves it by the given distance towards the direction of the high-frequency heating apparatus to be measured of the Y-direction to have the vertical-direction detector 25 closer to the periphery of the door 26. Then, the movable arm 52 automatically goes and comes back in the Z-direction by the interval equal to the distance 1 between the adjacent detectors of the vertical-direction detectors 28 and moves while the wave-mode apparatus the high-frequency heating apparatus 25 to be measured has made at least one rotation at a very fast speed. After the sweeping operation of the robot 31, the movable arm 52, the movable arm 53, the movable arm 54 automatically return to the original positions to notify the end from the robot controller 39 to the sequence controller 36.

As it is understood in advance that the time required for the wave-mode converting apparatus to make at least one rotation is equal to any high-frequency heating apparatus unless the type of the high-frequency heating apparatus 25 to be measured is not changed, the prescription is performed by the reciprocation sweeping speed of the movable arm 52 in the Z-direction, the sweeping distance, the reciprocation frequency.

Accordingly, in order to automatically control the robot 31 for the operation, the distance and speed of the movable arm 53 moving in the X-direction, the moving distance of the movable arm 52 in the Z-direction, the reciprocation sweeping distance, the reciprocation sweeping speed, the reciprocation sweeping frequency thereof, and the distance of the movable arm 54 moving in the W-direction are inputted and stored in advance in the robot controller 39 of the robot 31. Also, the variation is adapted to be performed even in a case where the type of the high-frequency heating apparatus 25 to be measured is varied, its outer-appearance size, and the time required for the wave-mode converting apparatus to be rotated vary.

Figure 16:
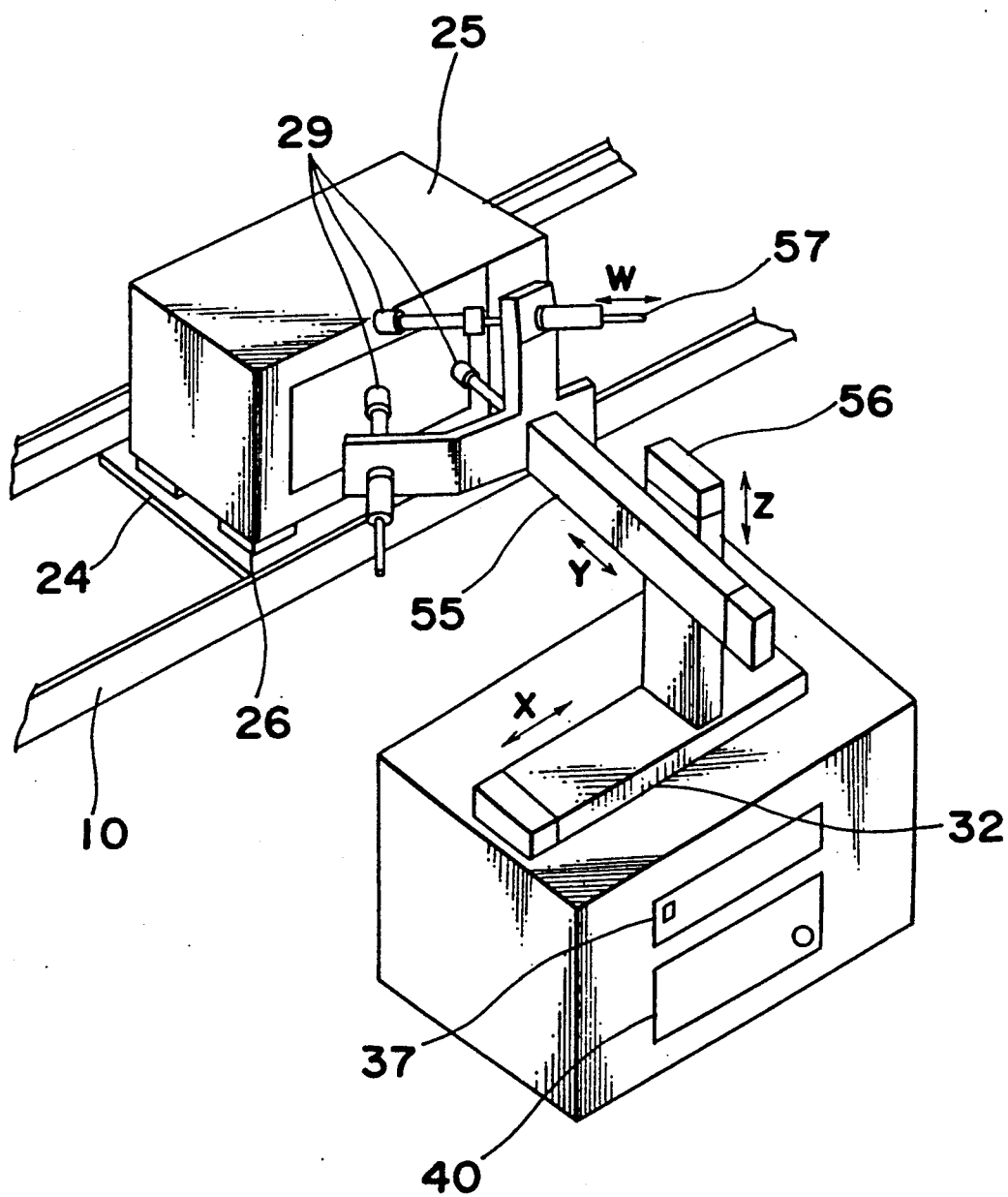

The movement of the robot 32 will be described hereinafter in accordance with FIG. 16. When the high-frequency heating apparatus 25 to be measured is secured to the given location of the conveyer 10, it notifies from the sequence controller 37 of the step to the central data processing computer 33 that the position data of the maximum wave-leakage location detected by the first power-density detector and the detector specification data for specifying one power-density detector among the detectors 29 for precise measurement use, which are second power-density detectors for measuring the maximum wave-leakage location may be fed to the robot controller 40 of the robot 32. The central data processing computer 33, the position data and the detector specification data to the robot controller 40 of the robot 32. It is notified that the position data and the detector specification data have been fed to the sequence controller 37 of this step. Then, the driving start of the robot 32 is transmitted to the robot controller 40 of the robot 32 from the sequence controller 37 of this step. It is to be noted that the position data is composed of the locations of the X-, Y-, Z-directions of the robot 32. The specified one detector 29 for precise measurement use moves, by a given distance towards the direction of the high-frequency heating apparatus 25 to be measured of the W-direction, through the air cylinder 57 directly connected with the detector. Also, the movable arm 56 moves in the X-direction, the movable arm 55 moves in the Y-direction, the Z-direction by the distance specified through the position data so as to bring the specified one detector 29 for precise measurement use closer to the maximum wave-leakage location on the periphery of the door 26 of the high-frequency heating apparatus 25 to be measured to rest it while the wave-mode converting apparatus of the high-frequency heating apparatus 25 to be measured makes at least one rotation. As the time required for the wave-mode converting apparatus makes at least one rotation is apparent in advance, it is inputted and stored in the robot controller 40 of the robot 32, so that the specified detector 29 for precise measurement comes to rest in the maximum wave-leakage location during this period. Also, after the passage of the inputted time stored in the robot controller 40 of the robot 32, the movable arm 55, the movable arm 56 and the air cylinder 57 automatically return to the original positions to notify the driving end of the robot 32 from the robot controller 40 to the sequence controller 37. The movement of the robot, in a case where a multiple articulated robot 58 which is capable of the movement and the measurement across the entire periphery of the door 26 of the high-frequency heating apparatus 25 to be measured by the second one power-density detector in the other embodiment, will be described in accordance with FIG. 13. When the high-frequency heating apparatus 25 to be measured is secured to the given location of the conveyer 10, it notifies from the sequence controller 65 of the central data processing computer 33 that the position data of the maximum wave-leakage location detected by the first power-density detector may be fed to the robot controller 66 of the multiple articulated robot 58. The central data processing computer 33 feeds the position data to the robot controller 66 of the multiple articulated robot 58 and thereafter notifies that the position has been fed to the sequence controller 65 of this step. Then, the driving start of the multiple articulated robot 58 is transmitted from the sequence controller 65 of this step to the robot controller 66 of the multiple articulated robot 58.

It is to be noted that the position data is composed of a turning angle $\phi 1$ of the turning drum 59, a bent angle $\phi 2$ of the bent arm 60, a bent angle $\phi 3$ of the bent arm 61, a bent angle φ4 of the bent arm 62, a rotation angle γ1 of the rotation arm 63, and a rotation angle γ2 of the rotation arm 64, the respective turning angles, bent angles and rotation angles thereof.

The multiple articulated robot 58 which has received the instructions of the driving start operates the turning drum 59, the bent arm 60, the bent arm 61, the bent arm 62, the rotation arm 63 and the rotation arm 64 to have the second power-density detectors, the detectors 29 for precise measurement use, closer to the maximum wave-leakage location on the periphery of the door 26 of the high-frequency heating apparatus 25 to be measured to rest it while the wave-mode converting apparatus the high-frequency heating apparatus 25 to be measured makes at least one rotation. As the wave-mode converting apparatus makes at least one rotation is clear in advance, it is inputted and memorized in the robot controller 66 of the multiple articulated robot 58, so that the detector 29 for the precise measurement use is adapted to rest at the maximum wave-leakage location during this period. Also, after the lapse of the time which has been inputted, memorized in the robot controller 66 of the multiple articulated robot 58, the turning drum 59, the bent arm 60, the bent arm 61, the bent arm 62, the rotation arm 63 and the rotation arm automatically return to the original positions to inform the driving end of the multiple articulated robot 58 to the sequence controller 65 of this step.

The method of measuring the leakage power density of the high-frequency heating apparatus in accordance with the present apparatus will be described hereinafter. The measurement by the present apparatus is composed of at least the following steps.

① A step of causing a first memorizing means to store the detection values of the power-density detectors in the respective positions of the sweeping operation, while sweeping the power-density detectors with the given track in the given positions of the high-frequency heating apparatus.

② A step of calculating the positions of the high-frequency heating apparatus showing the maximum value among the detection values of the power-density detector stored by the first memorizing means.

③ A step of movingly setting the power-density detector in the position of the calculated high-frequency heating apparatus.

④ A step of causing a second memorizing means to store the detection values of the power-density detectors after they have been movingly set.

⑤ A step of comparing the detection values, stored in the second memorizing means, with the given reference values.

⑥ A step of distinguishing the measured high-frequency heating apparatuses between the superior products and the defective products in accordance with the compared results.

⑦ A step of recording the compared results on the given form.

The inspecting method in the embodiment of the present measuring apparatus will be described in accordance with FIG. 9 and FIG. 17.

Figure 17C:
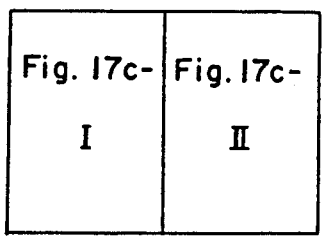
Figure 17C:
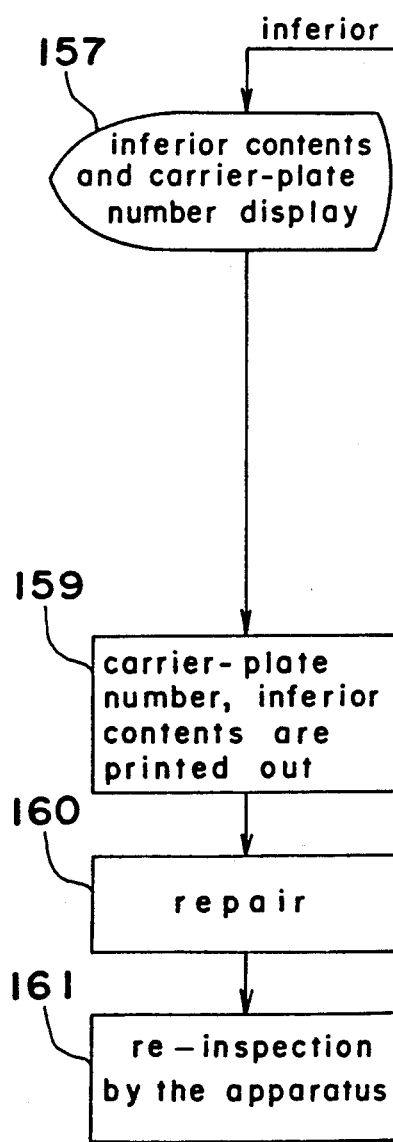
Figure 17C:
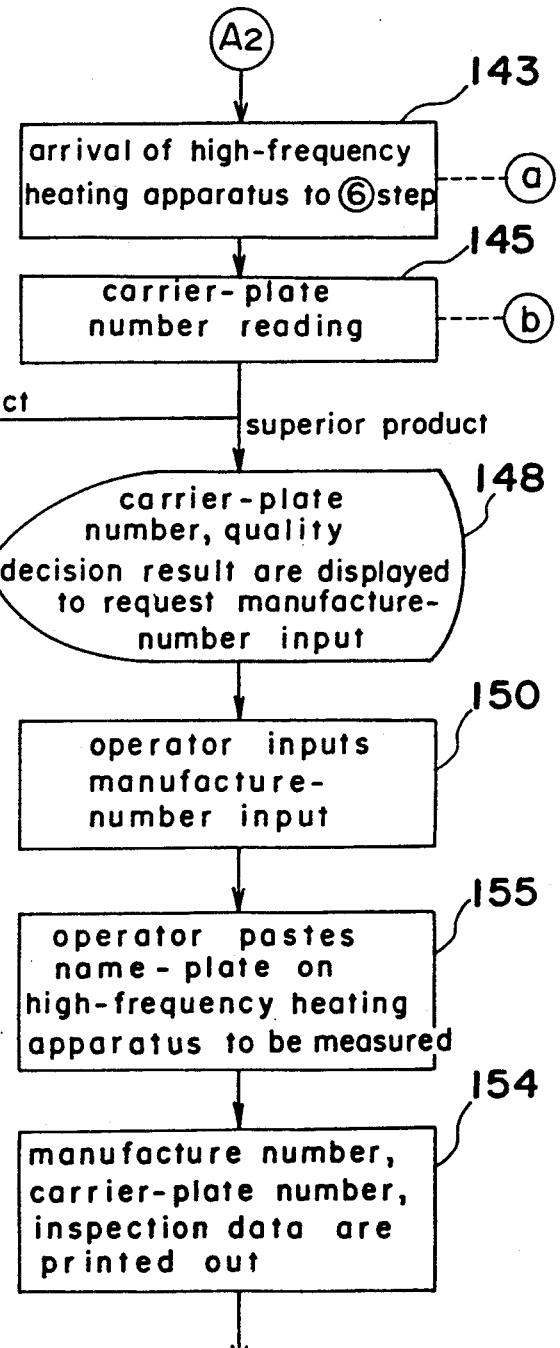

When the high-frequency heating apparatus to be measured arrives at the step of the ① in 101 of FIG. 17, the carrier-plate number is read in 102 by the carrier-plate reading apparatus 46 and is stored in the central data processing computer 33 in 103. Also, in 104, the inspection is performed, by the position detecting apparatus 45, as to whether or not the high-frequency heating apparatus 25 to be measured is set in the normal position of the carrier plate 24. If it proves to be good after the inspection, the carrier-plate stopper 18 is released in 105 to move the high-frequency heating apparatus 25 to be measured to the next ② step. If it proves to be defective after the inspection, it is corrected into the normal position by the operation during 106. Unless it proves to be superior after reinspection, the carrier-plate stopper 18 is not released, so that the high-frequency heating apparatus 25 to be measured does not move to the next ② step.

When the high-frequency heating apparatus 25 to be measured arrives at the ② step in 107, the arrival of the high-frequency heating apparatus to be measured is transmitted to the robot controller 38 and the central data processing computer 33 from the sequence controller 35 and the robot 30 starts the horizontal reciprocation sweeping operation in 108. Also, in 109, the central data processing computer 33 starts to read the leakage data to calculate in 110 the maximum wave-leakage location Ⓗ on the upper side and the lower side of the door 26 of the high-frequency heating apparatus 25 to be measured through the horizontal sweeping operation. Then, in 111, the calculated maximum wave-leakage location Ⓗ and the carrier-plate number, which is read at the step of the ①, is stored in the central data processing computer, are provided as a pair and are shifted in preparation for the measurement at the next ③ step. After the completion of the data, in 112, the central data processing computer 33 transmits the measuring completion to the sequence controller 35. The sequence controller 35 receives the measuring completion signal from the central data processing computer 33 and the robot sweeping completion signal from the robot controller 38, and in 113, releases the carrier-plate stopper 19 of the ② to feed the high-frequency heating apparatus 25 to be measured to the next ③ step. Then, when the high-frequency heating apparatus 25 to be measured to the ③ step in 114, the arrival of the high-frequency heating apparatus 25 to be measured is transmitted from the sequence controller 36 to the robot controller 39 and the central data processing computer 33, so that in 115, the robot 31 starts the vertical reciprocation sweeping operation. Also, the central data processing computer 33 starts the reading of the leakage data in 116 to calculate the maximum wave leakage location Ⓥ on the left side and the right side of the door 26 of the high-frequency heating apparatus 25 to be measured, in 117, by the vertical sweeping operation. Then, in 118, the maximum wave-leakage location Ⓥ and the maximum wave-leakage location Ⓗ are compared in the power density with each other and in 119, the higher one is calculated as the maximum wave-leakage location of the high-frequency heating apparatus 25 to be measured. And in 120, the calculated maximum wave-leakage location and the carrier-plate number are provided as a pair and are shifted in preparation for the measurement of the next ④ step. After the shift completion of the data, the central data processing computer 33 transmits, in 121, the measurement completion to the sequence controller 36. The sequence controller 36 receives the measurement completion signal from the central data processing computer 33 and the robot sweeping completion signal from the robot controller 39 and in 122, releases the carrier-plate stopper 20 of the ③ step to feed the high-frequency heating apparatus 25 to be measured to the ④ step.

Then, when the high-frequency heating apparatus 25 to be measured reaches the ④ step in 123, the arrival of the high-frequency heating apparatus 25 to be measured is transmitted to the central data processing computer 33 from the sequence controller 37. The central data processing computer 33 transmits the detector specified data of the detector 29 for the precise measurement use, and the maximum wave-leakage location, in 125, to the robot controller 40 and then transmits, in 125, to the sequence controller 37 the transmission of the detector-specification data and the maximum wave-leakage location to the robot controller 40. The sequence controller 37 instructs the driving start of the robot 32 to the robot controller 40 and transmits to the central data processing computer 33, the start of the power-density reading in 127 through the precise measurement by the detector 29 for the precise measurement in 126. The central data processing computer 33 calculates, in 128, the power density of the leakage waves read out to compare, in 129, the calculated power density with the quality decision reference to perform the quality decision in 130. After the completion of the quality decision, the central data processing computer 33 stores, in 131, the quality decision result, the maximum wave-leakage location, the power density of the maximum waves, and the carrier-plate number as one set. Also, it transmits the measurement completion end to the sequence controller 37.

The sequence controller 37 receives the measurement completion signal in 132 from the central data processing computer 33 and the driving completion signal from the robot controller 40 to transmit the release instructions of the carrier-plate stopper 21 of the ④ step and releases, in 133, the carrier-plate stopper 21 to send the high-frequency heating apparatus 25 to be measured to the next step ⑤. Then, when the high-frequency heating apparatus 25 to be measured arrives at the ⑤ step in 134, the arrival of the high-frequency heating apparatus 25 is transmitted from the sequence controller 37 to the central data processing computer 33. The central data processing computer 33 instructs to the high-frequency heating apparatus 25 of the superior product in 135 that the carrier-plate number and the wave-leakage measured result through the present apparatus should be displayed on the display 41.

The operator of the step confirms the displayed content in 136 and thereafter releases the carrier-plate stopper 22 in 137. He gives to the high-frequency heating apparatus 25 of the inferior product to be measured the instructions of extruding the inferior identification pin to the inferior identification pin extruding apparatus 48 of 138, the instructions for displaying the inferior contents and the carrier-plate number on the display 41 in 139, and the instructions to the printer 43 so that the inferior contents and the carrier-plate number may be printed out on the inferior information label. In this case, the operator of this step confirms that the contents of the inferior information label conforms to the displayed contents in 141 to paste the inferior information label in 142 on the high-frequency heating apparatus of the inferior product to be measured, thereafter releases the carrier-plate stopper 22 in 137 to feed the high-frequency heating apparatus 25 to be measured to the next ⑥ step. Then, when the high-frequency heating apparatus 25 to be measured arrives at the ⑥ step in 143, the arrival of the high-frequency heating apparatus 25 to be measured is directly transmitted to the central data processing computer 33. The carrier-plate number is read by the carrier-plate number reading apparatus 47 at 145 and is transmitted to the central data processing computer 33 in 146. The central data processing computer 33 selects from among the stored carrier-plate numbers the carrier-plate number which is the same in number as the carrier-plate number read out at this step in 147 to extract the quality decision result as one set, the maximum wave-leakage location, the power-density of the maximum wave-leakage to perform the next data processing operation in accordance with the quality-deciding results. Namely, when the high-frequency heating apparatus 25 to be measured is the superior product, the carrier-plate number and the quality decision results are displayed on the display in 148, 149 to urge the operator to input the manufacture number. When the operator of the step inputs the manufacture number from the keyboard of the display 42 in 150, the manufacture number is received in 1516 is received, as one set, together with the carrier-plate number for storing operation, the maximum wave-leakage location, the power-density of the maximum wave-leakage in 152 which are already stored within the central data processing computer 25. Also, he instructs the printer 44 in 153 so that these information may be printed out, and they are printed out in 154. It is to be noted that the operator of the step pastes the name plate with the manufacture number printed thereon on the high-frequency heating apparatus to be measured. This is the end of the inspection of the leakage waves in the present apparatus.

When the high-frequency heating apparatus 25 to be measured is an inferior product, the operator instructs in 156, 157 to the display 42 so that the carrier-plate number and the inferior contents may be displayed, in 158, 159 to the printer 42 so that the carrier-plate number and the inferior contents may be printed out. Then, the inferior products go to the repairing step in 160 for the repairing operation in 160 and thereafter are inspected again in 161 by the present apparatus.

As is clear from the foregoing description, according to the arrangement of the present invention, the wave-leakage measuring apparatus compares the power density of the leakage waves, in the portions of the upper side, the lower side, the left side, the right side of the high-frequency heating apparatus measured from two steps, with the leakage locations by the central data processing computer to select one of the maximum wave-leakage locations, brings one of the power-density detectors to the maximum wave-leakage location by the robot, rests it while the wave-mode converting apparatus makes at least one rotation to precisely measure the power density of the leakage waves so as to automatically decide the quality in the measured values by the central data processing computer, the two steps comprising the step of arranging a plurality of power-density detectors on the upper side and the lower side of the door of the high-frequency heating apparatus, continuously having the horizontal reciprocation sweeping operation for the time required for the wave-mode converting apparatus to be rotated by at least one at a speed sweeping the power-density detector from one end to the other end of the door of the high-frequency heating apparatus in a very short time in which one period of the wave-mode converting apparatus is equally divided into several portions, and the step of arranging a plurality of power-density detectors on the left side and the right side of the door of the high-frequency heating apparatus, continuously having the vertical reciprocation sweeping operation for the time required for the wave-mode converting apparatus to be rotated by at least one time at a speed sweeping the power-density detector from one end to the other end of the door of the high-frequency heating apparatus in a very short time in which one period of the wave-mode converting apparatus is equally divided into several portions. Accordingly, the maximum wave-leakage location may be precisely found without being almost influenced by changes in the power density caused through the rotation of the wave-mode converting apparatus, and the measurement of the power-density of the wave leakage may be performed in a very short time, which is equivalent to the time required for the wave-mode converting apparatus to be rotated by one time, thus greatly contributing towards the production improvement of the mass production step of the high-frequency heating apparatus.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. An apparatus for measuring microwave leakage of a device, said apparatus comprising:
    first and second power-density detecting means each for detecting a power-density level of the microwave leakage of the device, said first and second power-density detecting means movable relative to each other and operating independently from one another;
    a first driving means for separately moving said first power-density detecting means relative said second power density detecting means and for causing said first power-density detecting means to effect a scan of the device along a predetermined path and to detect a maximum microwave leakage location of the device, said scan being effected for a first preselected period of time whose duration is unaffected by the power-density level detected by said first power-density detecting means during said scan;
    a second driving means for separately moving said second power density detecting means relative said first power density detecting means and for causing said second power-density detecting means to become substantially stationary at a position in proximity to said maximum microwave leakage location detected by said first power-density detecting means, and for causing said second power-density detecting means to effect a measurement of a value of the power-density level at said maximum microwave leakage location for a second preselected period of time whose duration is unaffected by the power-density level detected by said second power-density detecting means during said measurement;
    wherein said first power-density detecting means has a response time of detecting the power-density level of the microwave leakage which is faster than that of said second power-density detecting means.

2. An apparatus as recited in claim 1, further comprising:
    a storing means for storing said value of the power-density level measured by said second power-density means;
    a comparing means for comparing a preselected reference value with said value of the power-density level stored in said storing means, and for providing an output value corresponding to the thus compared preselected reference value and value of the power-density level; and
    a display means for displaying said output value provided by said comparing means.

3. An apparatus as recited in claim 1, further comprising a conveying means for conveying the device, wherein said device is conveyed to a first test location for effecting said scan and thereafter conveyed to a second test location for effecting said measurement.

4. An apparatus as recited in claim 3, further comprising:
    a storing means for storing said value of the power-density level measured by said second power-density means;
    a comparing means for comparing a preselected reference value with said value of the power-density level stored in said storing means, and for providing an output value corresponding to the thus compared preselected reference value and value of the power-density level; and
    a display means for displaying said output value provided by said comparing means.

5. An apparatus as recited in claim 1, wherein said first and second preselected periods of time are of substantially a same duration.

6. An apparatus as recited in claim 5, further comprising:
    a storing means for storing said value of the power-density level measured by said second power-density means;
    a comparing means for comparing a preselected reference value with said value of the power-density level stored in said storing means, and for providing an output value corresponding to the thus compared preselected reference value and value of the power-density level; and
    a display means for displaying said output value provided by said comparing means.

7. An apparatus as recited in claim 5, further comprising a conveying means for conveying the device, wherein said device is conveyed to a first test location for effecting said scan and thereafter conveyed to a second test location for effecting said measurement.

8. An apparatus as recited in claim 7, further comprising:
    a storing means for storing said value of the power-density level measured by said second power-density means;
    a comparing means for comparing a preselected reference value with said value of the power-density level stored in said storing means, and for providing an output value corresponding to the thus compared preselected reference value and value of the power-density level; and
    a display means for displaying said output value provided by said comparing means.

9. An apparatus for measuring microwave leakage of a device, said apparatus comprising:
    first, second and third power-density detecting means each for detecting a power-density level of the microwave leakage of the device, said first, second and third power-density detecting means movable relative to each other and operating independently from one another;

a first driving means for separately moving said first power-density detecting means relative said second and third power-density detecting means and for causing said first power-density detecting means to effect a first scan of the device along a predetermined first direction and to detect a maximum microwave leakage location along said first direction, said first scan being effected for a first preselected period of time whose duration is unaffected by the power-density level detected by said first power-density detecting means during said first scan;

a second driving means for separately moving said second power-density detecting means relative said first and third power-density detecting means and for causing said second power-density detecting means to effect a second scan of the device along a predetermined second direction and to detect a maximum microwave leakage location along said second direction, said second scan being effected for a second preselected period of time whose duration is unaffected by the power-density level detected by said second power-density detecting means during said second scan;

wherein said first direction and said second direction are substantially perpendicular to each other;

a third driving means for separately moving said third power density detecting means relative said first and second power-density detecting means and for causing said third power-density detecting means to become substantially stationary at a position in proximity to one of said maximum microwave leakage locations at which a greater power-density level is detected by said first and second power-density detecting means, and for causing said third power-density detecting means to effect a measurement of a value of the power-density level at said one of said maximum microwave leakage locations for a third preselected period of time whose duration is unaffected by the power-density level detected by said third power-density detecting means during said measurement;

wherein said first and second power-density detecting means have a faster response time of detecting the power-density level of the microwave leakage relative to that of said third power-density detecting means.

10. An apparatus as recited in claim 9, further comprising:
a storing means for storing said value of the power-density level measured by said third power-density means;
a comparing means for comparing a preselected reference value with said value of the power-density level stored in said storing means, and for providing an output value corresponding to the thus compared preselected reference value and value of the power-density level; and
a display means for displaying said output value provided by said comparing means.

11. An apparatus as recited in claim 9, further comprising a conveying means for conveying the device, wherein said device is conveyed to a first test location for effecting said first scan and thereafter conveyed to a second test location for effecting said second scan and thereafter conveyed to a third test location for effecting said measurement.

12. An apparatus as recited in claim 11, further comprising:
a storing means for storing said value of the power-density level measured by said third power-density means;
a comparing means for comparing a preselected reference value with said value of the power-density level stored in said storing means, and for providing an output value corresponding to the thus compared preselected reference value and value of the power-density level; and
a display means for displaying said output value provided by said comparing means.

13. An apparatus as recited in claim 9, wherein said first, second and third preselected periods of time are of substantially a same duration.

14. An apparatus as recited in claim 13, further comprising:
a storing means for storing said value of the power-density level measured by said third power-density means;
a comparing means for comparing a preselected reference value with said value of the power-density level stored in said storing means, and for providing an output value corresponding to the thus compared preselected reference value and value of the power-density level; and
a display means for displaying said output value provided by said comparing means.

15. An apparatus as recited in claim 13, further comprising a conveying means for conveying the device, wherein said device is conveyed to a first test location for effecting said first scan and thereafter conveyed to a second test location for effecting said second scan and thereafter conveyed to a third test location for effecting said measurement.

16. An apparatus as recited in claim 15, further comprising:
a storing means for storing said value of the power-density level measured by said third power-density means;
a comparing means for comparing a preselected reference value with said value of the power-density level stored in said storing means, and for providing an output value corresponding to the thus compared preselected reference value and value of the power-density level; and
a display means for displaying said output value provided by said comparing means.

* * * * *